(12) United States Patent
Aoki et al.

(10) Patent No.: US 9,291,457 B2
(45) Date of Patent: Mar. 22, 2016

(54) METHOD OF MANUFACTURING ELECTRONIC DEVICE, ELECTRONIC DEVICE, ELECTRONIC APPARATUS, AND MOVING OBJECT

(71) Applicant: Seiko Epson Corporation, Tokyo (JP)

(72) Inventors: Shinya Aoki, Minowa (JP); Juichiro Matsuzawa, Minowa (JP); Osamu Kawauchi, Shiojiri (JP); Masaru Mikami, Minowa (JP)

(73) Assignee: Seiko Epson Corporation (JP)

( * ) Notice: Subject to any disclaimer, the term of this patent is extended or adjusted under 35 U.S.C. 154(b) by 31 days.

(21) Appl. No.: 14/164,807

(22) Filed: Jan. 27, 2014

(65) Prior Publication Data
US 2014/0211384 A1 Jul. 31, 2014

(30) Foreign Application Priority Data

Jan. 30, 2013 (JP) .................. 2013-015206
Jan. 30, 2013 (JP) .................. 2013-015207

(51) Int. Cl.
| | |
|---|---|
| H01L 21/00 | (2006.01) |
| H01L 23/10 | (2006.01) |
| G01C 19/5783 | (2012.01) |
| H05K 5/06 | (2006.01) |

(52) U.S. Cl.
CPC ............ *G01C 19/5783* (2013.01); *H05K 5/066* (2013.01)

(58) Field of Classification Search
CPC . H01L 21/4817; H01L 23/02; G01C 19/5783
USPC ............ 257/704, 710, 924, E23.128, E23.18, 257/E21.5, E21.501; 438/E21.5, 125
See application file for complete search history.

(56) References Cited

U.S. PATENT DOCUMENTS

| | | | | |
|---|---|---|---|---|
| 5,414,300 A | * | 5/1995 | Tozawa et al. ................. | 257/704 |
| 5,498,900 A | * | 3/1996 | Dunaway et al. .............. | 257/659 |
| 5,818,699 A | * | 10/1998 | Fukuoka ....................... | 361/760 |

FOREIGN PATENT DOCUMENTS

| | | |
|---|---|---|
| JP | 01-151813 | 6/1989 |
| JP | 2000-223604 A | 8/2000 |
| JP | 2002-359311 A | 12/2002 |

* cited by examiner

*Primary Examiner* — Jasmine Clark
(74) *Attorney, Agent, or Firm* — Harness, Dickey & Pierce, P.L.C.

(57) ABSTRACT

A method of manufacturing an electronic device in which an inner space for housing a gyro element is formed between a base and a lid and the base and the lid are bonded includes bonding the base and the lid in which a groove is provided on a surface to be bonded with the base so that the inner space communicates with the outside by not bonding the inner surface of the groove to the base and to position the groove around a concave portion provided on a side surface of the base, and closing a communication portion by irradiating a laser beam to the lid in the communication portion.

8 Claims, 13 Drawing Sheets

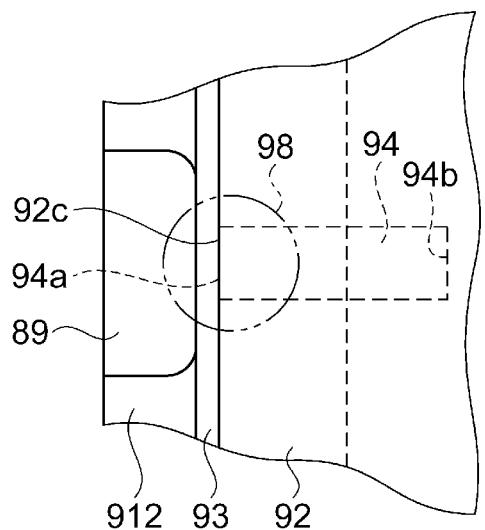
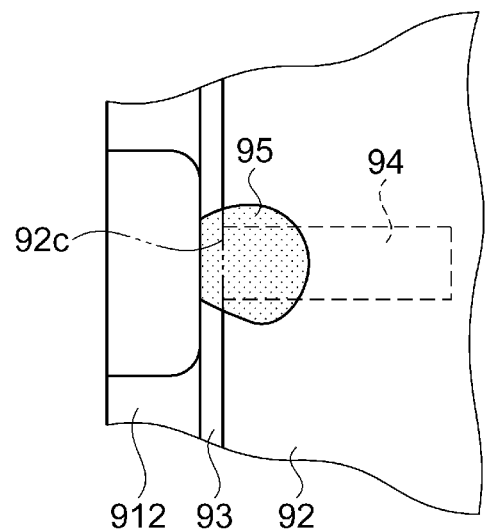
FIG. 6A    FIG. 6C
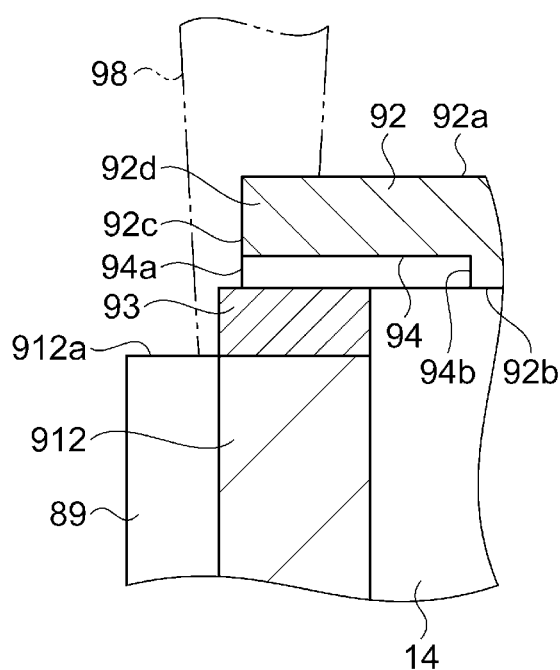
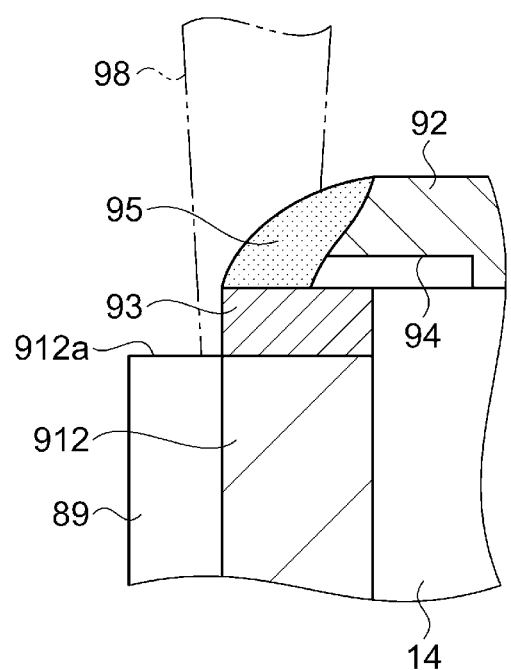
FIG. 6B    FIG. 6D

METHOD OF MANUFACTURING ELECTRONIC DEVICE, ELECTRONIC DEVICE, ELECTRONIC APPARATUS, AND MOVING OBJECT

BACKGROUND

1. Technical Field

The present invention relates to a method of manufacturing an electronic device, an electronic device, an electronic apparatus, and a moving object.

2. Related Art

In recent years, portable type electronic apparatuses have been popularized and along with the popularization, there has been an increasing demand for a reduction in size, weight and cost of the electronic apparatuses. Therefore, there has been an increasing demand for a reduction in size and cost of electronic components used in the electronic apparatuses while high accuracy is maintained. Particularly, since vibration characteristics are maintained in vibration devices in which a vibration element is housed in a package by airtightly maintaining a space for housing the vibration element, various sealing techniques have been proposed.

For example, in bonding methods disclosed in JP-A-2000-223604 and JP-A-2002-359311, a lid that covers an opening portion of a space for housing a vibration device element (vibration element), and a peripheral edge of the opening portion are welded while some parts thereof are left and deaeration is performed, and then, the unwelded parts thereof are sealed. In addition, in a small sized crystal vibrator disclosed in JP-A-1-151813, a notch is formed on a surface of a package to be bonded with a lid, the lid and package are bonded by melting a metal brazing material while a part of a portion except for the notch is left, and deaeration is performed. Then, the metal brazing material of the notch portion is re-melted to seal the lid and the package.

However, in the bonding methods disclosed in JP-A-2000-223604 and JP-A-2002-359311, since the lid and the peripheral edge of the opening portion are welded while some parts are left, and after the deaeration, the unwelded portions are welded, it is not easy to control the dimensions of the unwelded portions and the like stably. Also, since the deaeration from a small gap between the unwelded portions is performed, deaeration time is increased, and thus, the number of man-hours required for sealing is increased. In addition, in the configuration disclosed in JP-A-1-151813, since the deaeration is performed while the metal brazing material is melted, it is necessary to control the molten state and the deaeration and sealing cannot be performed stably. Thus, there is a concern that vibration characteristics may be unstable.

SUMMARY

An advantage of some aspect of the invention is to solve at least a part of the problems described above and the invention can be implemented as the following forms or application examples.

Application Example 1

This application example is directed to a method of manufacturing an electronic device in which an inner space for housing an electronic component is formed between a base and a lid body, and the base and the lid body are bonded, the method including: preparing the lid body having a groove on a surface to be bonded with the base; housing the electronic component in the inner space; bonding the lid body to a bonding surface of the base in a portion except an unbonded portion including at least apart of the groove in a predetermined bonding region of the base and the lid body in a state in which the inner space and an outside communicate with each other through the groove; and closing the unbonded portion by energy beam welding in a state in which a part of an irradiation range of an energy beam is positioned outside the bonding surface in a plan view seen from a side of the base to which the lid body is bonded.

According to the method of manufacturing an electronic device, the lid body and the base are bonded so that the inner space and the outside communicate with each other through the groove provided in the lid body. In this manner, by the groove through which the inner space and the outside communicate with each other, the pressure of the inner space can be easily reduced, or the inside of the inner space can be easily made to an inert gas atmosphere. By closing the groove in a communication portion by the energy beam welding, the inner space in which the pressure is reduced or the inside is made to be the inert gas atmosphere can be sealed. Thus, sealing can be realized after a gas generated during the bonding of the lid body is removed from the inside of the package, and high quality airtight sealing can be realized.

In addition, since the closing of the unbonded portion is performed so that a part of the irradiation range of the energy beam is positioned outside of the bonding surface of the base, the energy beam that is irradiated to close the communication portion is irradiated to the outside of the bonding surface of the communication portion with the lid body, and the base can be prevented from being directly irradiated. Therefore, it is possible to prevent damage (for example, melting or microcracks) of the base due to the energy beam irradiation from occurring.

Application Example 2

This application example is directed to the method of manufacturing an electronic device according to the application example described above, wherein in the closing of the unbonded portion, the unbonded portion is closed by the energy beam welding in a state in which apart of the irradiation range of the energy beam is positioned outside the bonding surface in a concave portion provided on a side surface of the base.

According to the method of manufacturing an electronic device, the energy beam that is irradiated to close the communication portion is irradiated to the communication portion of the lid body and the concave portion, and the base can be prevented from being directly irradiated. Therefore, it is possible to prevent damage (for example, melting or microcracks) of the base due to the energy beam irradiation from occurring.

Application Example 3

This application example is directed to the method of manufacturing an electronic device according to the application example described above, wherein the concave portion is provided from the bonding surface to an opposite surface of the bonding surface.

In this manner, since the concave portion is provided from the bonding surface of the base that is a surface to which the lid body is bonded to the opposite surface of the bonding surface, the base can be more reliably prevented from being irradiated with the energy beam.

Application Example 4

This application example is directed to the method of manufacturing an electronic device according to the application example described above, wherein a bonding material is provided between the base and the lid body, in the bonding of the lid body, the base and the lid body is bonded by the bonding material in a state in which a part of the bonding material is exposed from the lid body in the plane view, and in the closing of the unbonded portion, the unbonded portion is closed by the energy beam welding in a state in which a part of the irradiation range of the energy beam overlaps with the portion of the bonding material exposed from the lid body in the plane view.

According to the method of manufacturing an electronic device, the bonding material serves as a material protecting from the energy beam, and the base can be prevented from being directly irradiated with the energy beam.

Application Example 5

This application example is directed to the method of manufacturing an electronic device according to the application example described above, wherein a bonding material is provided between the base and the lid body, in the bonding of the lid body, the base and the lid body are bonded by the bonding material in a state in which a part of the bonding material is exposed from the lid body in the plane view and the bonding material overlaps with at least a part of the concave portion, and in the closing of the unbonded portion, the unbonded portion is closed by the energy beam welding in a state in which a part of the irradiation range of the energy beam overlaps with the portion of the bonding material which overlaps with the concave portion and is exposed from the lid body in the plane view.

In this manner, since the base and the lid body are bonded so that at least a part of the concave portion overlaps with the bonding material in the plan view, the bonding material serves as a material protecting from the energy beam, and the base can be more reliably prevented from being directly irradiated with the energy beam.

Application Example 6

This application example is directed to the method of manufacturing an electronic device according to the application example described above, wherein in the bonding of the lid body, the base and the lid body are bonded to position at least a part of the groove between the inner space and the concave portion in the plan view.

In this manner, since the lid body and the base are bonded so that at least a part of a position in which a portion of the lid body opened to an outer periphery of the groove is present overlaps with a position in which the concave portion is present in a direction along a linear side portion of an outer periphery of the lid body in which the groove is provided, the energy beam that is irradiated to close the communication portion is irradiated to the communication portion of the lid body and the concave portion, and the base can be prevented from being directly irradiated. Therefore, it is possible to prevent damage (for example, melting or micro-cracks) of the base due to the energy beam irradiation from occurring.

Application Example 7

This application example is directed to the method of manufacturing an electronic device according to the application example described above, wherein in the bonding of the lid body, the energy beam irradiation is performed a plurality of times in a divided manner.

In this manner, since a range (size) of a melting portion of the lid body melted by the energy beam irradiation to close the groove can be limited by the energy beam welding in which the energy beam irradiation is performed a plurality of times in a divided manner, and the temperature when the melting portion is melted can be adjusted to an appropriate temperature, it is possible to suppress an amount of gas generated from the melting portion. Therefore, it is possible to prevent characteristics of the electronic device from being deteriorated due to an influence of residual gas in the inner space.

Application Example 8

This application example is directed to a manufacturing method of an electronic device in which an inner space for housing an electronic component is formed between a base and a lid body, and the base and the lid body are bonded, the method including: preparing the lid body having a groove on a surface to be bonded with the base; housing the electronic component in the inner space; bonding the lid body to a bonding surface of the base by a bonding material in a portion except an unbonded portion including at least a part of the groove in a predetermined bonding region of the base and the lid body in a state in which the inner space and an outside communicate with each other through the groove and a part of the bonding material is exposed from the lid body in a plan view seen from a side of the base to which the lid body is bonded; and closing the unbonded portion by energy beam welding in a state in which a part of an irradiation range of an energy beam overlaps with the portion of the bonding material exposed from the lid body in the plan view.

According to the method of manufacturing an electronic device, the lid body and the base are bonded so that the inner space and the outside communicate with each other through the groove provided in the lid body. In this manner, by the groove through which the inner space and the base communicate with each other, the pressure of the inner space can be easily reduced, or the inside of the inner space can be easily made to an inert gas atmosphere. By closing the groove by a melting portion of the communication portion melted by irradiating the energy beam to the communication portion, the inner space in which the pressure is reduced or the inside is made to the inert gas atmosphere can be sealed. Thus, sealing can be realized after the gas generated during the bonding of the lid body is removed from the inside of the package, and thus, an electronic device in which an influence of inner gas is prevented and airtight sealing is reliably performed can be realized.

In addition, since the closing of the unbonded portion is performed so that a part of the irradiation range of the energy beam overlaps with the portion of the bonding material exposed from the lid body, the bonding material serves as a material protecting from the energy beam, and the base can be prevented from being directly irradiated with the energy beam. Therefore, it is possible to prevent damage (for example, melting or micro-cracks) of the base due to the energy beam irradiation from occurring.

Application Example 9

This application example is directed to an electronic device in which an inner space for housing an electronic component is provided between a base and a lid body, and the base and the lid body are bonded, in which the lid body has a groove which is formed on a surface to be bonded with the base and closed by a melting portion formed by melting a part of the lid body, and in a plan view, the melting portion is positioned between an concave portion provided on a side surface of the base and the inner space.

In this manner, since the lid body and the base are bonded so that at least a part of a position in which a portion of the lid body opened to an outer periphery of the groove is present overlaps with a position in which the concave portion is present in a direction along a linear side portion of an outer periphery of the lid body in which the groove is provided, the energy beam that is irradiated to close the communication portion is irradiated to the communication portion of the lid body and the concave portion, and the base can be prevented from being directly irradiated. Therefore, it is possible to prevent damage (for example, melting or micro-cracks) of the base due to the energy beam irradiation from occurring.

Application Example 10

This application example is directed to the electronic device according to the application example described above, wherein the concave portion is provided from a bonding surface of the base that is a surface to which a bonding material is bonded to an opposite surface of the bonding surface.

In this manner, since the concave portion is provided from the bonding surface of the base that is the surface to which the bonding material is bonded to the opposite surface of the bonding surface, the base can be more reliably prevented from being irradiated with the energy beam.

Application Example 11

This application example is directed to the electronic device according to the application example described above, wherein the bonding material is provided between the base and the lid body, and the base and the lid body are bonded so that the bonding material overlaps with at least a part of the concave portion in the plan view.

In this manner, since the base and the lid body are bonded so that the bonding material overlaps with at least a part of the concave portion in the plan view, the bonding material serves as a material protecting from the energy beam, and thus, the base can be more reliably prevented from being irradiated with the energy beam.

Application Example 12

This application example is directed to an electronic apparatus including the electronic device according to the application example described above.

According to the electronic apparatus, an electronic apparatus with excellent reliability can be obtained.

Application Example 13

This application example is directed to a moving object including the electronic device according to the application example described above.

According to the moving object, a moving object with excellent reliability can be obtained.

BRIEF DESCRIPTION OF THE DRAWINGS

The invention will be described with reference to the accompanying drawings, wherein like numbers reference like elements.

FIG. 2A is a plan view and FIG. 2B is a front cross-sectional view.

FIG. 4A is a plan view, FIG. 4B is a front cross-sectional view, and FIG. 4C is cross-sectional view taken along the line Q-Q in FIG. 4A.

FIGS. 6A to 6D are views showing a sealing process, and FIG. 6A is a plan view showing a correlation between a groove and an energy beam, FIG. 6B is a front view of FIG. 6A, FIG. 6C is a plan view of a sealing portion, and FIG. 6D is a front cross-sectional view of FIG. 6C.

FIG. 8A is a (partial) plan view and FIG. 8B is a (partial) front cross-sectional view.

DESCRIPTION OF EXEMPLARY EMBODIMENTS

Hereinafter, a method of manufacturing an electronic device will be described in detail with reference to the accompanying drawings.

First Embodiment of Electronic Device

First, an embodiment of a vibrator as a first embodiment of an electronic device manufactured by applying a method of manufacturing an electronic device according to the invention will be described.

Figure 1:
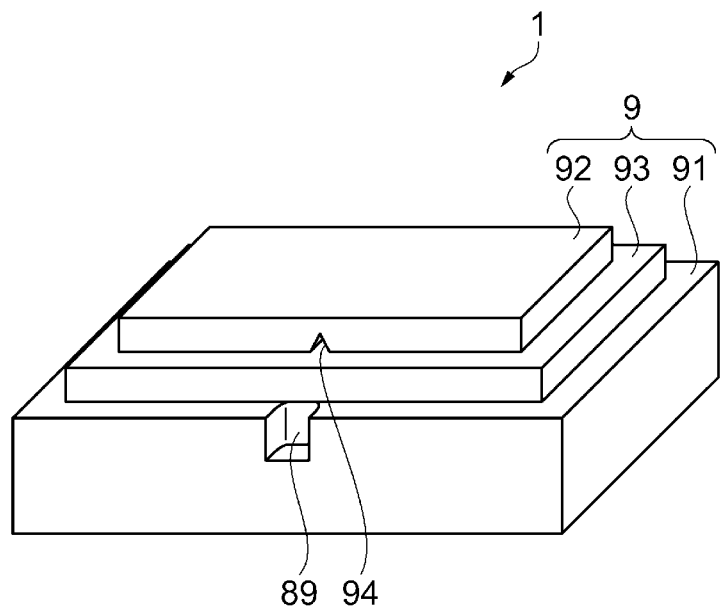
FIG. 1 is a perspective view schematically showing a vibrator as a first embodiment of an electronic device.
Figure 2A:
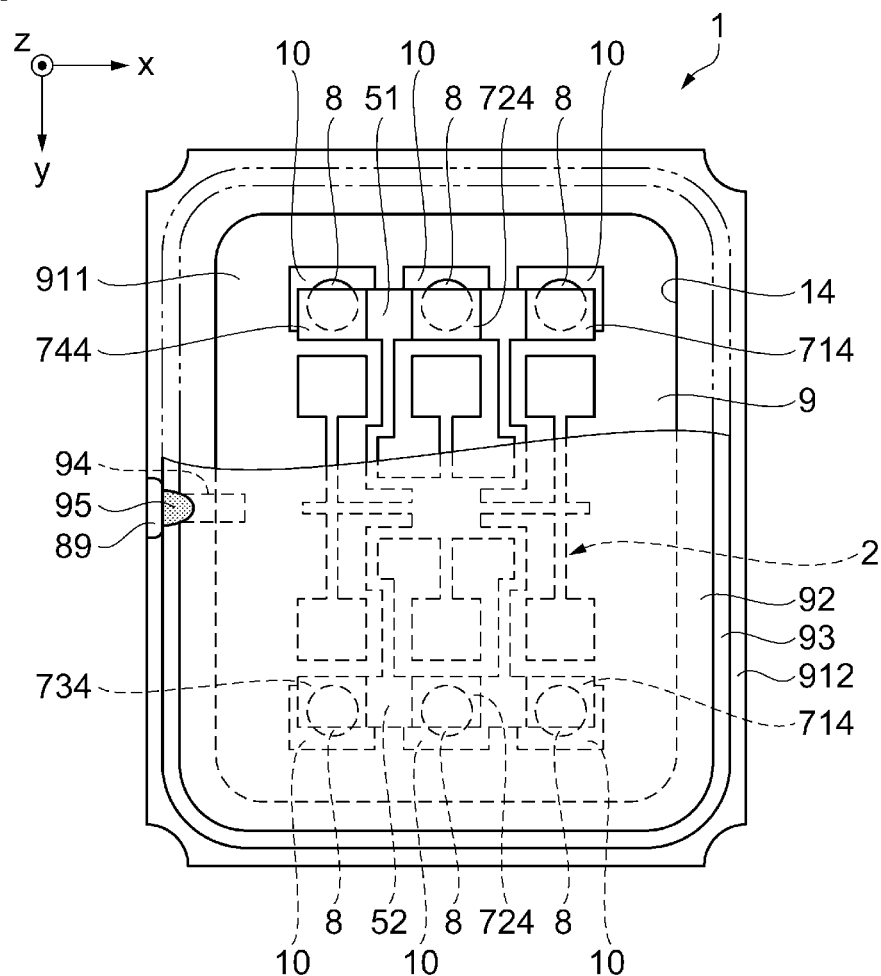
FIGS. 2A and 2B are schematic views showing the vibrator as the first embodiment of the electronic device.
Figure 2B:
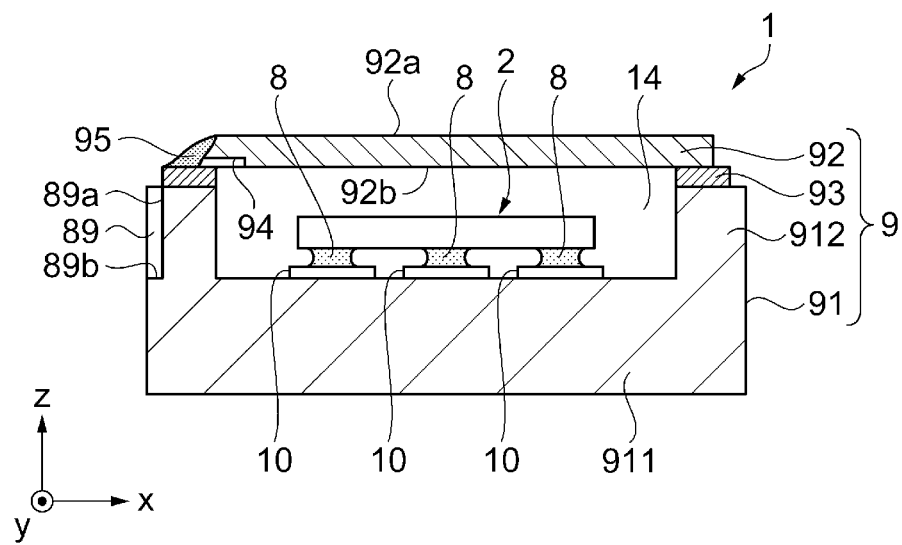
Figure 3:
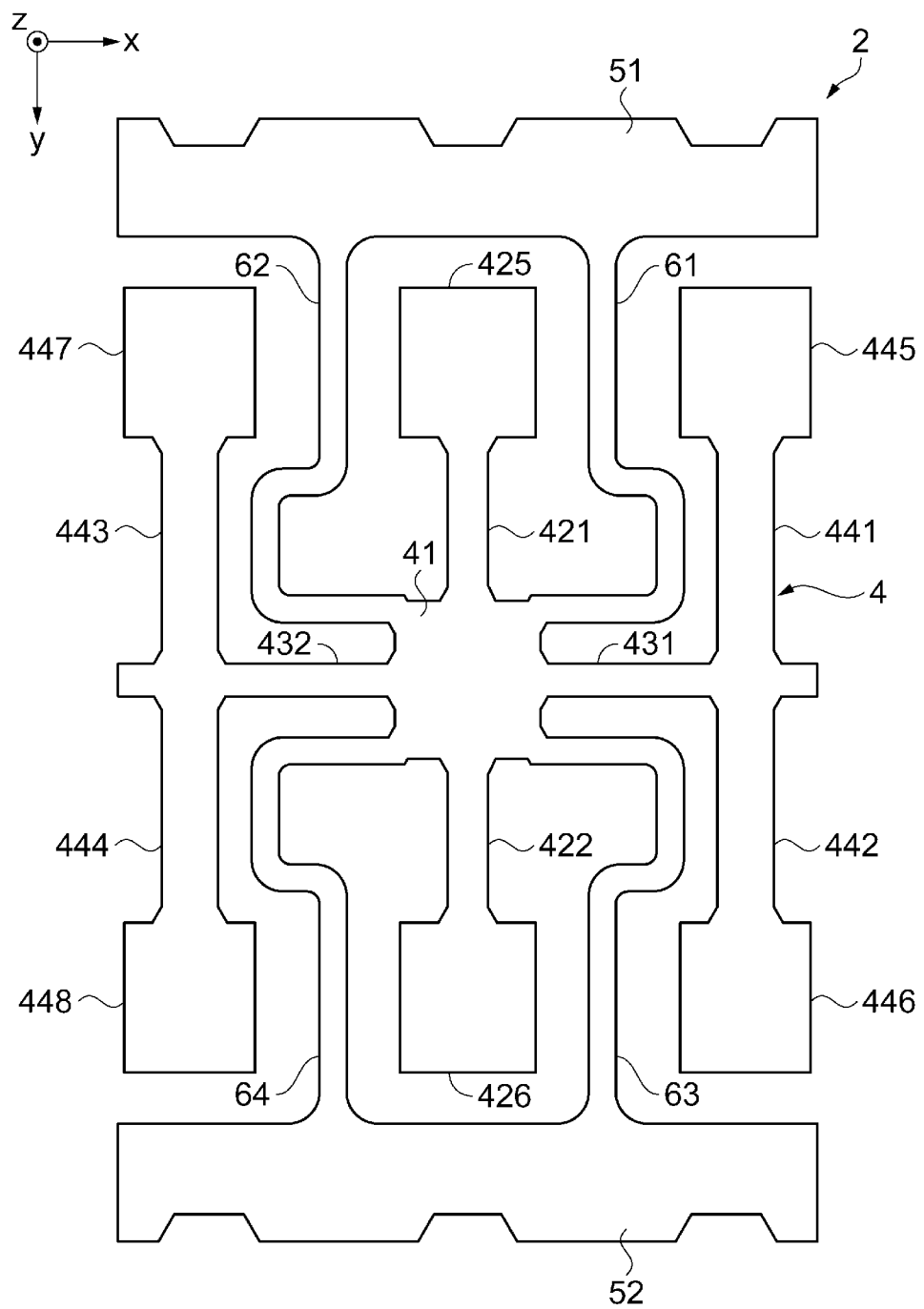
FIG. 3 is a plan view showing a gyro element as an electronic component used in the electronic device.

FIG. 1 is a schematic perspective view showing the vibrator as the first embodiment of the electronic device according to the invention. FIGS. 2A and 2B are schematic views showing the vibrator as the first embodiment of the electronic device according to the invention, and FIG. 2A is a plan view and FIG. 2B is a front cross-sectional view. FIG. 3 is a plan view showing a gyro element as an electronic component including the vibrator shown in FIGS. 2A and 2B. As shown in FIGS. 2A and 2B, an x axis, a y axis, and a z axis are shown below as three axes perpendicular to one another, and the z axis coincides with a thickness direction of the vibrator. In addition, a direction parallel to the x axis is referred to as an "x-axis direction (second direction)", a direction parallel to the y axis is referred to as a "y-axis direction (first direction)", and a direction parallel to the z axis is referred to as a "z-axis direction".

The vibrator 1 shown in FIGS. 1 and 2A and 2B as an example of the electronic device includes a gyro element (vibration element) 2 as the electronic component, and a package 9 which houses the gyro element 2. The gyro element 2 and the package 9 will be sequentially described in detail below. In the package 9 shown in FIG. 1, a base 91, a seam ring 93 as a bonding material, and a lid 92 as a lid body are included. In the same drawing, a groove 94 that is provided in the lid 92 is shown, and a state in which sealing (sealing process) described later is not performed is shown.

Gyro Element

FIG. 3 is a plan view of the gyro element when seen from above (z-axis direction of FIGS. 2A and 2*b* that is a lid 92 side which will be described later). In the gyro element, a detection signal electrode, a detection signal wiring line, a detection signal terminal, a detection ground electrode, a detection ground wiring line, a detection ground terminal, a drive signal electrode, a drive signal wiring line, a drive signal terminal, a drive ground electrode, a drive ground wiring line, a drive ground terminal, and the like are provided, and are not shown in the same drawing.

The gyro element 2 is an "out-of-plane detection type" sensor which detects an angular velocity around the z axis. Although not shown in the drawing, the gyro element includes a substrate and plural electrodes, wiring lines, and terminals provided on the surface of the substrate. The gyro element 2 may be formed of piezoelectric materials, such as quartz crystal, lithium tantalate, and lithium niobate. Among these materials, it is preferable to form the gyro element using quartz crystal. Thus, it is possible to obtain the gyro element 2 capable of exhibiting excellent vibration characteristics (frequency characteristics).

Such a gyro element 2 includes a so-called double T type vibrating body 4, a first support portion 51 and a second support portions 52 as support portions that support the vibrating body 4, and a first beam 61, a second beam 62, a third beam 63, and a fourth beam 64 as beams that connect the vibrating body 4 to the first and second support portions 51 and 52.

The vibrating body 4 extends on the xy plane, and has a thickness in the z-axis direction. Such a vibrating body 4 includes a base portion 41 positioned at the center, a first detection vibrating arm 421 and a second detection vibrating arm 422 extending from the base portion 41 to both sides along the y-axis direction, a first connecting arm 431 and a second connecting arm 432 extending from the base portion 41 to both sides along the x-axis direction, a first drive vibrating arm 441 and a second drive vibrating arm 442 as vibrating arms extending from the distal end portion of the first connecting arm 431 to both sides along the y-axis direction, and a third drive vibrating arm 443 and a fourth drive vibrating arm 444 as vibrating arms extending from the distal end portion of the second connecting arm 432 to both sides along the y-axis direction. In the distal end portion of each of the first and second detection vibrating arms 421 and 422 and the first, second, third and fourth drive vibrating arms 441, 442, 443, and 444, weight portions (hammer heads) 425, 426, 445, 446, 447 and 448 as approximately rectangular wide portions having a greater width than the proximal end side are provided. The angular velocity detection sensitivity of the gyro element 2 is improved by providing such weight portions 425, 426, 445, 446, 447 and 448.

In addition, the first and second support portions 51 and 52 extend along the x-axis direction, and the vibrating body 4 is positioned between the first and second support portions 51 and 52. In other words, the first and second support portions 51 and 52 are arranged so as to face each other along the y-axis direction with the vibrating body 4 interposed therebetween. The first support portion 51 is connected to the base portion 41 through the first and second beams 61 and 62, and the second support portion 52 is connected to the base portion 41 through the third and fourth beams 63 and 64.

The first beam 61 passes between the first detection vibrating arm 421 and the first drive vibrating arm 441 to connect the first support portion 51 and the base portion 41 to each other, the second beam 62 passes between the first detection vibrating arm 421 and the third drive vibrating arm 443 to connect the first support portion 51 and the base portion 41 to each other, the third beam 63 passes between the second detection vibrating arm 422 and the second drive vibrating arm 442 to connect the second support portion 52 and the base portion 41 to each other, and the fourth beam 64 passes between the second detection vibrating arm 422 and the fourth drive vibrating arm 444 to connect the second support portion 52 and the base portion 41 to each other.

Each of the beams 61, 62, 63, and 64 has a long and narrow shape with a meandering portion that extends along the y-axis direction while going back and forth along the x-axis direction, and the beams 61, 62, 63, and 64 have elasticity in all directions. Therefore, even if an impact is applied from the outside, it is possible to reduce or suppress detection noise due to the external impact since the beams 61, 62, 63, and 64 serve to absorb the impact.

The gyro element 2 having such a configuration detects the angular velocity $\omega$ around the z axis as follows. In the gyro element 2, each of the drive vibrating arms 441, 442, 443, and 444 performs flexural vibration in the x-axis direction when an electric field is generated between the drive signal electrode (not shown) and the drive ground electrode (not shown) in a state where the angular velocity $\omega$ is not applied. During this time, since the first and second drive vibrating arms 441 and 442 and the third and fourth drive vibrating arms 443 and 444 perform a symmetrical vibration with respect to the yz plane passing through the center point (center of gravity), the base portion 41, the first and second connecting arms 431 and 432, and the first and second detection vibrating arms 421 and 422 almost do not vibrate.

When the angular velocity $\omega$ around the z axis is applied to the gyro element 2 in a state where this drive vibration is performed, the Coriolis force acts on the drive vibrating arms 441, 442, 443, and 444 and the connecting arms 431 and 432 in the y-axis direction, and a detection vibration in the x-axis direction is excited in response to the vibration in the y-axis direction. Then, the detection signal electrode (not shown) and the detection ground electrode (not shown) detect the distortion of the detection vibrating arms 421 and 422 generated by this vibration. As a result, the angular velocity $\omega$ is calculated.

Package

The package 9 houses the gyro element 2 therein. In addition, not only the gyro element 2 but also an IC chip for performing the driving of the gyro element 2 and the like may be housed in the package 9, similar to the electronic device which will be described later. Such a package 9 has an approximately rectangular shape in a plan view (xy plan view).

As shown in FIGS. 1 and 2A and 2B, the package 9 has the base 91 having a concave portion that is opened to the upper surface, and the lid 92 as the lid body that is bonded to the base through the seam ring 93 as the bonding material so as to close an opening of the concave portion. In addition, the base 91 has a plate-shaped bottom plate 911 and a frame-shaped side wall 912 that is provided on the peripheral edge portion of the upper surface of the bottom plate 911. The frame-shaped side wall 912 is provided in an approximately rectangular peripheral shape, that is, the shape of the opening opened to the upper surface of the concave portion is formed in an approximately rectangular shape. The concave portion surrounded by the plate-shaped bottom plate 911 and the frame-shaped side wall 912 becomes an inner space (housing space) 14 which houses the gyro element 2 as the electronic component. On the upper surface of the frame-shaped side wall 912, for example, the seam ring 93 formed of an alloy such as kovar is provided. The seam ring 93 functions as the bonding material between the lid 92 and the side wall 912 and is provided in a frame shape (approximately rectangular peripheral shape) along the upper surface of the side wall 912.

The groove 94 with a bottom, which has an outer shape of an approximately rectangular shape and is provided from the outer periphery to the center portion, is provided on a rear surface 92b of the lid 92. The configuration of the lid 92 will be described in detail later. When the lid 92 is placed on the seam ring 93, the groove 94 is arranged so as to overlap with the inner space 14. On the side wall 912, a concave portion 89 is provided at a position facing the groove 94 of the lid 92 placed on the seam ring 93. The concave portion 89 has a concave shape which is recessed toward the inside from the outer surface of the side wall 912. An inner wall surface 89a which is a bottom surface of the concave portion 89 seen from the outer surface direction of the side wall 912 (x-axis direction in the drawing) is formed with a depth in which the inner wall surface substantially overlaps with the outer edge of the placed lid 92. In addition, a bottom surface 89b of the concave portion 89 seen from the lid 92 side (z-axis direction in the drawing) is formed with a depth which is approximately the same as the thickness of the side wall 912.

Such a package 9 has the inner space 14 therein and the gyro element 2 is airtightly housed in the inner space 14. After exhaust (deaeration) from the groove 94 is performed, the inner space 14 in which the gyro element 2 is housed is sealed with a sealing portion 95 as a melting portion formed by melting the lid 92, which is left in a communication portion in which the groove 94 is formed, using an energy beam (for example, a laser beam) and then, solidifying the melting portion, that is, solidifying with the sealing portion 95 by energy beam welding. The sealing portion 95 as the melting portion is formed by melting and solidifying the end portion of the outer side of the groove 94, that is, a portion including an outer peripheral surface 92c of the lid 92 (refer to FIGS. 4A to 4C).

Materials of the base 91 are not particularly limited, and various ceramics, such as aluminum oxide, can be used. In addition, although materials of the lid 92 are not particularly limited, a member having a linear expansion coefficient similar to that of the material of the base 91 may be used. For example, when the above-described ceramic is used as a material of the base 91, it is preferable to use an alloy, such as kovar.

The gyro element 2 is fixed to the upper surface of the bottom plate 911 through a conductive fixing member 8, such as solder, silver paste, and conductive adhesive (adhesive in which a conductive filler, such as metal particles, is dispersed in a resin material) in the first and second support portions 51 and 52. Since the first and second support portions 51 and 52 are positioned at both ends of the gyro element 2 in the y-axis direction, the vibrating body 4 of the gyro element 2 is supported at both ends by fixing such the portions to the bottom plate 911. As a result, it is possible to stably fix the gyro element 2 to the bottom plate 911. For this reason, since an unnecessary vibration (vibration other than detection vibration) of the gyro element 2 is suppressed, the detection accuracy of the angular velocity ω by the gyro element 2 is improved.

In addition, six conductive fixing members 8 are provided so as to correspond to (be in contact with) two detection signal terminals 714, two detection ground terminals 724, a drive signal terminal 734, and a drive ground terminal 744 provided in the first and second support portions 51 and 52 and so as to be separated from each other. In addition, six connection pads 10 corresponding to the two detection signal terminals 714, the two detection ground terminals 724, the drive signal terminal 734, and the drive ground terminal 744 are provided on the upper surface of the bottom plate 911, and each connection pad 10 and each terminal corresponding thereto are electrically connected through the conductive fixing member 8.

Lid as Lid Body

Figure 4A:
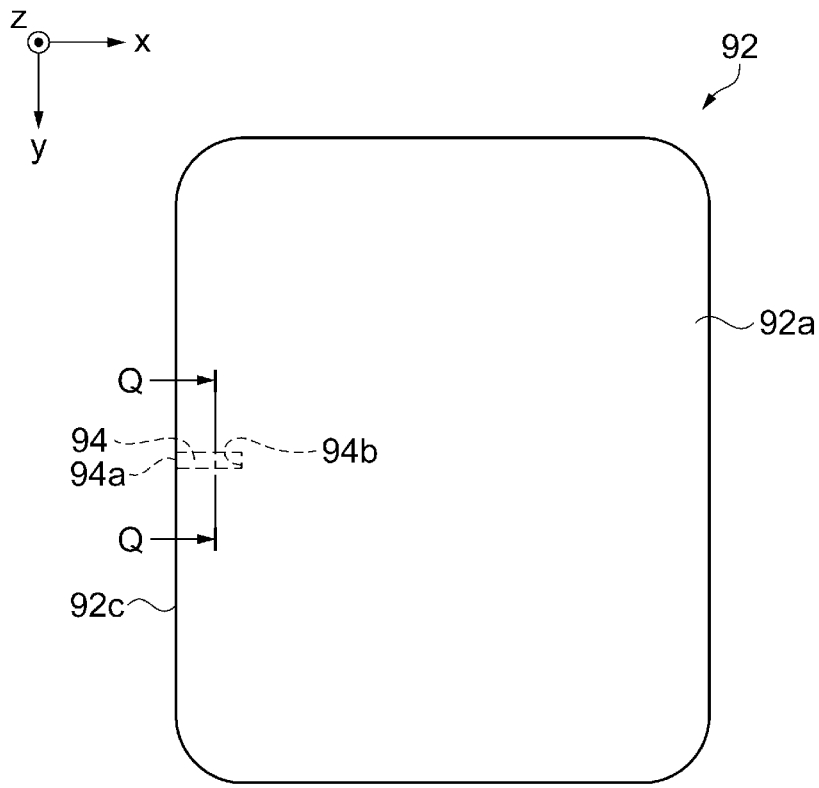
FIGS. 4A to 4C show an example of a lid body (lid) used in the electronic device.
Figure 4B:
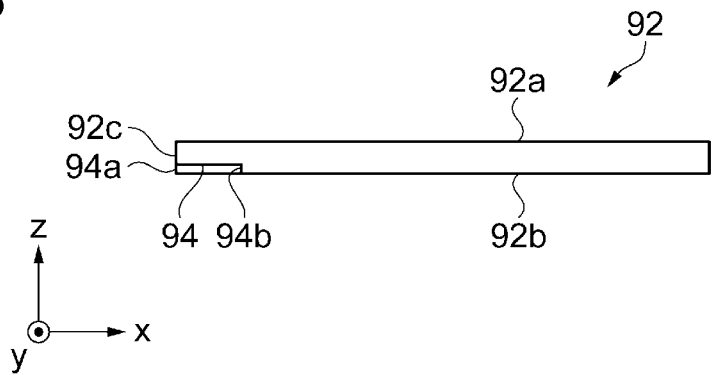
Figure 4C:
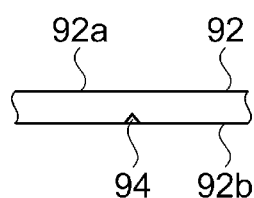

Here, using FIGS. 4A to 4C, the lid 92 as the lid body will be described. FIGS. 4A to 4C show an example of the lid as the lid body according to the invention, FIG. 4A is a plan view, FIG. 4B is a front cross-sectional view, and FIG. 4C is a cross-sectional view taken along the line Q-Q in FIG. 4A.

The lid 92 as the lid body closes the opening of the concave portion opened to the upper surface of the package 9 and is bonded to the periphery of the opening of the concave portion, for example, by using a seam welding method. Specifically, the lid 92 is a plate-shaped member having a surface 92a and a rear surface 92b having a front-rear relationship, and an outer peripheral surface 92c connecting the surface 92a and the rear surface 92b. In this example, since the lid 92 is formed in a plate shape, formation is easily performed and further, shape stability is excellent. Particularly, although the groove 94 which will be described later is a very small groove, the groove can be easily formed. In addition, in this example, a kovar plate is used to form the lid 92. Since the seam ring 93 formed of kovar and the lid 92 are melted in the same molten state and further, easily alloyed during sealing by using the kovar plate for the lid 92, sealing can be easily and reliably performed. Instead of kovar, plates formed of other materials may be used for the lid 92, and for example, metal materials such as 42 alloy and stainless steel, or the same material as the side wall 912 of the package 9 can be used.

When the lid 92 is seen from a surface 92a side in a plan view, the groove 94 with a bottom, which is provided from one side portion of the outer peripheral surface 92c to the center portion of the lid 92, is provided on a rear surface 92b side. The groove 94 is provided with the opening formed in a wedge shape (for example, a triangle having two apexes on the rear surface 92b side) seen from the outer peripheral surface 92c side and is positioned substantially in the center portion of one side portion in the plan view. When the lid 92 is placed so as to close the opening of the concave portion opened to the upper surface of the package 9, the groove 94 is provided from the outer peripheral surface 92c of the lid 92 to the center portion so as to have a portion overlapping with the opening. In other words, the groove 94 has one end 94a that is opened to the outer peripheral surface 92c, and the other end 94b in the center portion side, and the other end 94b in the center portion side is provided so as to reach the inner side (center side of the package in the plan view) from the inner wall of the frame-shaped side wall 912 that is provided in the peripheral edge portion of the upper surface of the bottom plate 911 forming the base 91. By providing the groove 94 in this manner, exhaust from the inner space 14 of the package 9 can be performed. In addition, since the other end 94b is provided on the center portion side of the lid 92 in the groove

94, the exhaust can be performed in one direction. That is, sealing can be realized by welding (welding for closing) one portion to one groove.

In the embodiment, the groove 94 is positioned approximately at the center portion of the one side portion which becomes a long side in the plan view, but there is no limitation thereto. The groove 94 may be provided in at least any one of the side portions. In addition, the groove 94 may be provided in one side portion which becomes a short side in the plan view. By providing the groove 94 on the short side in the plan view, the following effect can be obtained. A large deformation of the package 9 in the thickness direction (z-axis direction) occurs more easily in the long side direction than in the short side direction. Therefore, a greater residual stress is present in the lid 92 bonded to the package 9 in the long side direction than in the short side direction. When the groove 94 is sealed (described later) while the large residual stress is maintained, the residual stress is applied to the sealed portion and there is a concern that reliability in sealing may be deteriorated. Thus, by providing the groove 94 on the short side which has a relatively small residual stress, the sealed portion can be less influenced by the residual stress.

In addition, the width of the groove 94 is not particularly limited, but the width is preferably about 1 μm or more and 200 μm or less. Further, the depth of the groove 94 is not particularly limited, but the depth is preferably about 5 μm or more and 30 μm or less.

In addition, a metal layer (not shown) that can be melted by seam welding is formed respectively in the base 91 and the lid 92 in the bonding portion of the base 91 and the lid 92, and then, welding is performed. In this case, the depth of the groove 94 is preferably greater than the sum of thicknesses of the two metal layers (the metal layer provided in the base 91 and the metal layer provided in the lid 92). Accordingly, in a bonding process described later, the lid 92 and the base 91 can be rigidly bonded by seam welding without closing the groove 94 formed on the surface of the lid 92 bonded to the base 91.

The exhaust of the concave portion (inner space 14) formed from a gap between the package 9 and the lid 92 is performed by the groove 94, and then, one of or both the lid 92 and the seam ring 93 in the communication portion in which the groove 94 is provided are melted by an energy beam such as a laser beam. In this manner, the groove 94 is closed by the sealing portion 95 as the melting portion formed by melting one of or both the lid 92 and the seam ring 93 to seal the inner space 14 airtightly.

In the embodiment, one groove 94 is provided in the lid 92, but the number and arrangement of the groove are not particularly limited. Plural grooves may be provided and further, the grooves may be provided on the surface 92a and the rear surface 92b of the lid 92.

In addition, the cross-sectional shape of the wall surface of the groove 94 shown in FIG. 4C may be any shape such as a rectangular shape, a curved shape, or a semicircular shape (arc shape) as long as the groove has a function of an exhaust hole.

Method of Manufacturing Vibrator

Next, a method of manufacturing the vibrator as the electronic device according to the invention will be described with reference to FIGS. 5A to 6D. FIGS. 5A to 5D are front cross-sectional views schematically showing a process of manufacturing the vibrator as the above-described electronic device shown in FIGS. 1 to 2B. FIGS. 6A to 6D are views showing a sealing process, and FIG. 6A is a plan view showing a correlation between the groove and the energy beam (laser beam), FIG. 6B is a front cross-sectional view of FIG. 6A, FIG. 6C is a plan view of a sealing portion, and FIG. 6D is a front cross-sectional view of FIG. 6C.

Figure 5A:
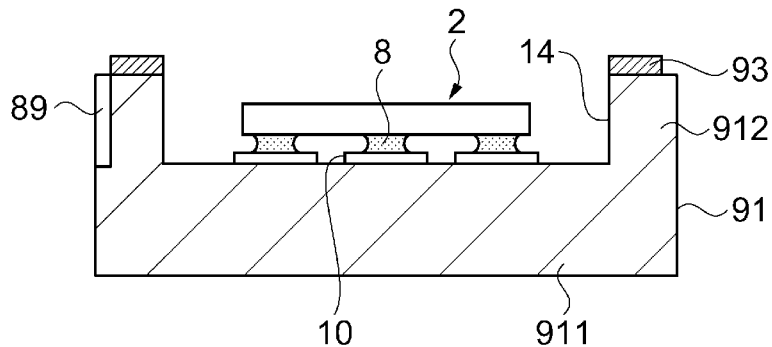
FIGS. 5A to 5D are front cross-sectional views schematically showing a process of manufacturing the vibrator as the electronic device.

First, a process of housing the gyro element 2 as the electronic component in the inner space 14 of the base 91 will be described. As shown in FIG. 5A, the base 91 having the plate-shaped bottom plate 911, the frame-shaped side wall 912 that is provided on the peripheral edge portion of the upper surface of the bottom plate 911, and the concave inner space 14 that is surrounded by the bottom plate 911 and the inner wall of the side wall 912 and opened to the upper surface are prepared. In the base 91, the seam ring 93 is formed on the upper surface of the frame-shaped side wall 912, and the connection pads 10 are formed on the upper surface of the bottom plate 911. The concave portion 89, which is recessed from the side surface with a length approximately equal to the thickness of the side wall 912 from the upper surface of the side wall 912, is provided on the side surface which is an outside (outer side) as seen from the inner space 14 of the side wall 912. In addition, the above-described gyro element 2 is prepared. Then, the connection pads 10 and the gyro element 2 are electrically connected and fixed to each other. In the connection, the conductive fixing member 8, such as solder, silver paste, and conductive adhesive (adhesive in which a conductive filler, such as metal particles, is dispersed in a resin material) can be used. At this time, there is gap between the gyro element 2 and the upper surface of the bottom plate 911 due to the thickness of the conductive fixing member 8.

Figure 5B:
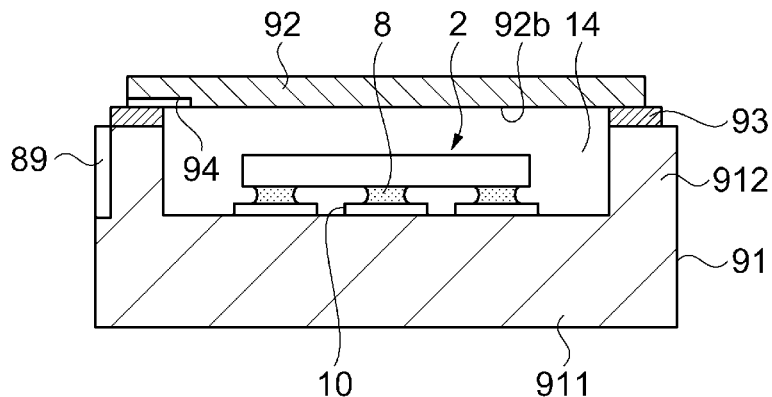

Next, a process of placing the lid 92 as the lid body on the inner space 14 will be described. As shown in FIG. 5B, in order to maintain the gyro element 2 housed in the inner space 14 as airtight, the above-described lid 92 as the lid body is placed on the seam ring 93. On the rear surface 92b of the lid 92, the groove 94 is provided. The lid 92 is arranged around the concave portion 89 provided on the side wall 912, specifically, arranged such that the concave portion 89 is positioned on an extended line toward the outside of the groove 94 in the plan view (as seen from the lid 92 side). Specifically, in the plan view, the lid 92 is arranged so that at least a part of the groove 94 of the lid 92 is positioned between the inner space 14 and the concave portion 89. More specifically, in the plan view, the lid 92 is arranged such that one end 94a of the groove 94 that is opened to the outer peripheral surface 92c of the lid 92 is positioned between the inner space 14 and the concave portion 89. Further, when the lid 92 is placed on the seam ring 93, the groove 94 extends so as to overlap with the inner space 14. That is, after the process of placing the lid 92, a local gap as the communication portion by which the inner space 14 communicates with the base 91 through the groove 94 is formed between the lid 92 and the seam ring 93.

Figure 5C:
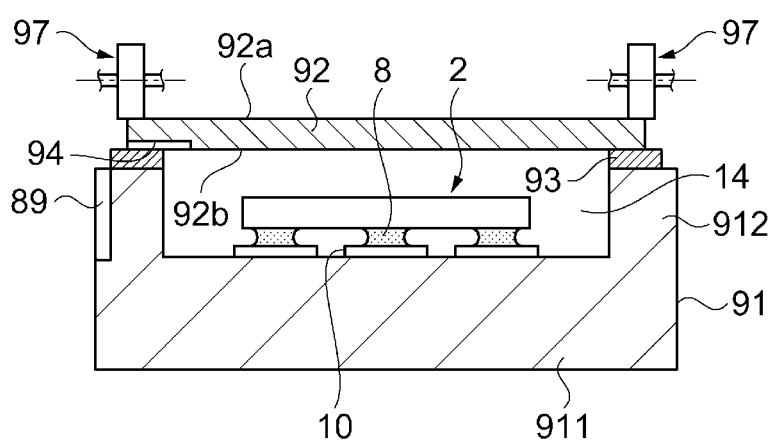

Next, a process of bonding the lid 92 to the base 91 by the seam ring 93 will be described. As shown in FIG. 5C, seam welding is performed on a portion in which the lid 92 faces the seam ring 93 on the frame-shaped side wall 912 in a peripherally rectangular shape using roller electrodes 97 of a seam welding machine to bond the lid 92 and the seam ring 93. That is, the lid 92 is bonded to the base 91. The roller electrodes 97 are brought into pressure contact with the lid 92 from the opposite side of the base 91 by a pressurization mechanism (not shown). Then, while rotating around the axis line, the roller electrodes 97 run on the outer peripheral side in the plan view of the lid 92 at a predetermined velocity. At this time, the seam ring 93 or bonding metal is melted by Joule heat by allowing a current to flow between the roller electrodes 97 through the lid 92 and the seam ring 93 to bond the lid 92 and the seam ring 93.

At this time, since the lid 92 and the seam ring 93 are not in contact with each other by the groove 94, the lid 92 in the portion in which the groove 94 is provided is not seam-welded and is left unwelded. In other words, since the inner surface of the groove 94 is not in contact with the seam ring 93, the lid is not seam-welded. That is, in the bonding process, in a predetermined bonding region of the base 91 and the lid 92, a portion except for the unbonded portion including the portion corresponding to the groove 94 is bonded by seam welding. Since the inner space 14 communicates with the outside of the base 91 through the groove 94, the unwelded space functions as an exhaust hole in the next process.

Figure 5D:
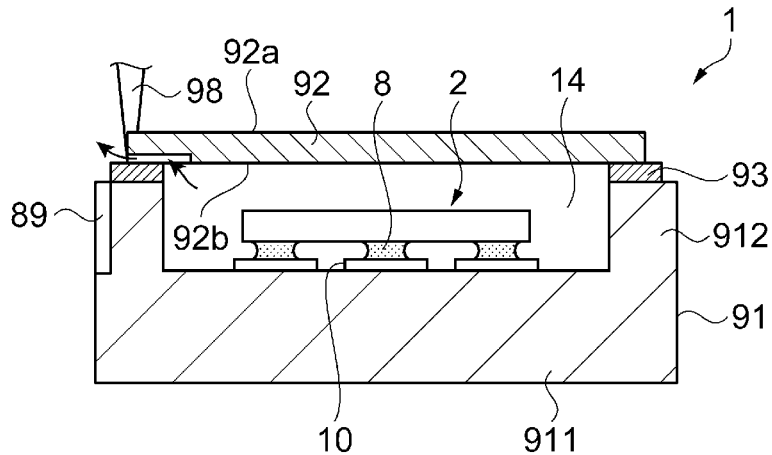

Next, a process of performing exhaust from the inner space 14 using the groove 94 (exhaust hole) will be described. In the embodiment, as shown in FIG. 5D, the groove 94 which is not welded during the above-described seam welding extends as the communication portion that reaches the inner space 14. Accordingly, the gas in the inner space 14 can be exhausted by using groove 94 as the exhaust hole as indicated by an arrow in the same drawing. In the embodiment, sealing is performed in a state in which the gas in the inner space 14 is exhausted, under so-called reduced pressure. However, sealing can be performed not only under reduced pressure but also under an inert gas atmosphere in which an inert gas is introduced after the exhaust.

Next, a process of airtightly sealing the inner space 14 after the exhaust is completed will be described using FIGS. 6A to 6D. As shown in FIGS. 6A and 6B, in a state in which the exhaust of the inner space 14 is completed, the portion (communication portion) corresponding to the groove 94 used as the exhaust hole is irradiated with the energy beam (for example, a laser beam and an electron beam). The following irradiation conditions which will be described later can be applied to the irradiation with the energy beam. In the embodiment, a laser beam 98 is irradiated as the energy beam to melt the metal (kovar) of the left portion. At this time, the laser beam 98 is arranged such that the end portion on the outer side of the groove 94, that is, one end 94a of the groove 94 including the outer peripheral surface 92c of the lid 92 is included in the spot of the laser beam 98. Then, the laser beam 98 is irradiated. Then, as shown in FIGS. 6C and 6D, a groove upper portion 92d on the surface 92a side of the lid 92 in the portion in which the groove 94 is provided is melted by heat energy generated by the irradiation with the laser beam 98, and while the groove 94 is filled with the molten metal, the molten metal flows on the seam ring 93. When the molten metal flows sufficiently, if the irradiation with the laser beam 98 is stopped, the molten metal is solidified. This solidified molten metal serves as the sealing portion (melting portion) 95 to seal (close) the groove 94 airtightly. As a result, in the plan view, the sealing portion (melting portion) 95 of the lid 92 is positioned between the inner space 14 and the concave portion 89.

As described above, the laser beam 98 is arranged such that the end portion on the outer side of the groove 94, that is, the end portion of the groove 94 including the outer peripheral surface 92c of the lid 92, is included in the spot of the laser beam. The laser beam is irradiated to melt the groove upper portion 92d of the lid including the end portion of the groove 94. Then, the molten metal having a good fluidity is improved. The groove 94 can be reliably sealed by improving the molten metal in this manner.

At this time, since the lid 92 is arranged such that the concave portion 89 is positioned on an extended line toward the outside of the groove 94 in the plan view (as seen from the lid 92 side), the laser beam 98, which is irradiated from the lid 92 to the outside, is irradiated to the concave portion 89. That is, an upper surface 912a of the side wall 912 can be prevented from being directly irradiated with the laser beam 98 by providing the concave portion 89. Therefore, it is possible to prevent damage (for example, melting of the side wall 912 or micro-cracks generated on the side wall 912) of the base (side wall 912) due to the irradiation with the laser beam 98 from occurring.

By using the method of manufacturing the vibrator 1 as the electronic device having such a process, the sealing portion 95 as the melting portion in which the fluidity of the molten metal by the laser beam 98 is improved can be reliably formed while the side wall 912 forming the base 91 is prevented from being influenced by the laser beam 98. Accordingly, the groove 94 can be reliably sealed and the vibrator 1 can be manufactured as the electronic device in which reliability in airtightness is improved. In addition, since the groove 94 serves as an exhaust hole as it is, dimension control of an unbonded portion (exhaust hole) used for exhaust in the related art is not necessary and stable exhaust and bonding (sealing) are performed. Thus, it is possible to suppress gas generated even in the case where the vibrator 1 is heated at a high temperature after bonding (sealing). Further, by stable exhaust and bonding (sealing), characteristics of the gyro element 2 as the electronic component that is housed in the package 9 can be prevented from being deteriorated due to the influence of the residual gas. Thus, it is possible to provide the vibrator 1 as the electronic device with stable characteristics.

In the above-described description, the example in which one exhaust hole (groove 94) is used has been described, but plural exhaust holes may be provided. As describe above, when the plural exhaust holes are used, an exhaust velocity is increased, but plural sealing portions are required.

In the above-described description, the configuration in which the concave portion 89 is provided in the base 91 has been described, but the concave portion 89 may not be provided. In this case, the unbonded portion is closed by the laser beam 98 in the sealing process in a state in which a part of the irradiation range of the laser beam 98 is positioned outside of the bonding surface of the base 91 that is a surface to which the lid 92 is bonded. Thus, the upper surface 912a of the base 91 can be prevented from being directly irradiated with the laser beam 98. That is, it is possible to prevent damage (for example, melting of the side wall 912 or micro-cracks generated on the side wall 912) of the base (side wall 912) due to the irradiation with the laser beam 98 from occurring.

In Case of Performing Process of Sealing Groove and Gas Exhaust at the Same Time In addition, in the above-described description, the example in which the gas exhaust of the inner space 14 is completed using the groove 94 (exhaust hole) and then the process of sealing the groove 94 by the laser beam is performed has been described. However, the process of sealing the groove 94 and the gas exhaust of the inner space 14 using the groove 94 may be performed at the same time. In this case, since the groove 94 is sealed while the gas is exhausted from the inner space 14, the gas generated from the molten metal of the lid 92 melted by the laser beam can be exhausted from the inner space 14. In the process of sealing the groove 94 by the laser beam, the exhaust can be performed at least from when the irradiation with the laser beam 98 is started to when the molten metal of the lid 92 melted by the laser beam 98 closes the groove 94. In this case, by exhausting the residual gas in the inner space 14, characteristics of the gyro element 2 are prevented from being deteriorated due to the influence of the residual gas, and it is possible to provide the vibrator 1 as the electronic device with stable characteristics.

Energy Beam Irradiation Conditions in Process of Sealing Groove

In the process of sealing the groove 94, if the continuous irradiation with the laser beam 98 as the energy beam to seal the groove 94 is performed once, some of the gas generated from the melting portion 95 of the lid 92 may enter the inner space 14. In this state, if the groove 94 is sealed, there is a problem in that the gas entering the inner space 14 is not sufficiently exhausted from the inner space 14 and remains in the inner space. Further, if the continuous irradiation with the laser beam 98 is performed once, the lid 92 is melted in a wide range having a part of the lid 92 to which the laser beam 98 is irradiated as a center and at a high temperature. Therefore, a large amount of gas is generated from the melting portion 95, and as a result, there is a problem in that the residual gas in the inner space 14 is increased.

Here, in the embodiment, the irradiation with the laser beam 98 is performed plural times in a divided manner in the process of sealing the groove 94. That is, the irradiation with the laser beam 98 is intermittently performed two or more times. Specifically, the irradiation with the laser beam 98 is performed so that two or more periods, each including an irradiation state in which the laser beam 98 is irradiated, and a non-irradiation state in which the laser beam 98 is not irradiated immediately after the irradiation state, are included from the start of the process of sealing the groove 94 to the end of the process. For example, the laser beam 98 is irradiated so that the two or more periods, each including the irradiation state in which the laser beam 98 is irradiated for a time from 1 ms to 1,000 ms, and the non-irradiation state in which the laser beam 98 is not irradiated for a time from 1 ms to 1,000 ms immediately after the irradiation state, are included from the process of sealing the groove 94 to the end of the process. Further, in this case, the process of sealing the groove 94 can be performed while the exhaust of the inner space 14 is performed through the groove 94. In this manner, by performing the irradiation with the laser beam 98 plural times in a divided manner, the communication portion in which the inner space 14 communicates with the outside when the irradiation with the laser beam 98 is started gradually becomes narrower due to the molten metal of the lid 92 melted by the laser beam 98 as the number of irradiation with the laser beam 98 increases.

In this manner, the time from the start of the sealing of the groove 94 to the end of the sealing, more specifically, the time from when the irradiation with the laser beam 98 is started to when the molten metal of the lid 92 melted by the laser beam 98 closes the groove 94 (hereinafter, referred to as a sealing time of the groove 94) can be increased by performing the irradiation with the laser beam 98 plural times in a divided manner, compared to a case in which the continuous irradiation is performed once, and in a state in which the gas generated from the melting portion 95 of the lid 92 is sufficiently exhausted from the inner space 14, the groove 94 can be sealed. Particularly, if the output of the energy beam cannot be decreased to a predetermined value or less due to restrictions of an energy beam generating device, it is not easy to decrease the output of the energy beam to increase the sealing time of the groove 94 in some cases. However, the sealing time appropriate for sealing the groove 94 can be easily adjusted and the range (size) of the melting portion 95 of the lid 92 can be limited by performing the irradiation with the laser beam 98 plural times in a divided manner, specifically, by setting the time and number of times in the non-irradiation state of the laser beam 98 and the time and number of times in the irradiation state. Further, since the temperature can be adjusted to be appropriate without an excessive increase in the temperature when the melting portion 95 is melted, an amount of gas generated from the melting portion 95 can be suppressed. As a result, by exhausting the residual gas in the inner space 14, characteristics of the gyro element 2 can be prevented from being deteriorated due to an influence of the residual gas, and it is possible to provide the vibrator 1 as the electronic device with stable characteristics.

In the above-described embodiment, a mode in which the non-irradiation state and the irradiation state of the laser beam 98 are repeated has been described. However, as another mode, a first irradiation state in which the irradiation with the laser beam 98 is performed, and a second irradiation state in which the irradiation with the laser beam 98 is performed with a weaker intensity than in the first irradiation state may be repeated. That is, the output of the laser beam 98 may be changed as time passes and the communication portion may become narrower gradually so as to be closed.

In addition, in the above-described embodiment, the concave portion 89 has been positioned on an extended line toward the outside of the groove 94 in the plan view to prevent damage of the base (side wall 912). However, there is no limitation thereto. The above-described irradiation conditions of the energy beam can be applied to a structure in which the concave portion 89 is not present around the groove 94.

Modification Examples of Bonding Process and Bonding Structure

In the above-described first embodiment, the bonding method in which seam welding is performed by the roller electrodes 97 of the seam welding machine using the seam ring 93 that is a ring-shaped metal frame as the bonding material for bonding the base 91 and the lid 92 has been described. However, another bonding method can be used. That is, as another bonding method, a bonding method (so-called direct seam method) in which a brazing material such as a silver brazing material as a bonding material is arranged on the upper surface of the frame-shaped side wall 912 of the base 91 or the surface of the lid 92, and the brazing material is melted by the roller electrodes 97 of the seam welding machine to bond the lid 92 and the base 91 using the molten metal brazing material can be applied. In this case, the metal brazing material may be melted by an energy beam such as a laser or an electron beam. As still another bonding method, a bonding method in which a part of the lid is melted to directly bond the lid 92 and the base 91 using the molten member of the lid, instead of bonding the lid 92 and the base 91 through the bonding material, can be applied. According to these bonding methods, since the seam ring 93 is not necessary, a reduction in size and cost of the electronic device can be realized.

Modification Examples of Groove Arrangement in Bonding Process

In the above-described first embodiment, as shown in FIG. 6A, when the lid 92 is bonded to the base 91 placed on the seam ring 93, the communication portion in which the inner space 14 communicates with the outside of the base 91 through the groove 94 is formed by providing the groove 94 to extend from the outer peripheral surface 92c of the lid 92 so as to overlap with the inner space 14. However, the groove 94 may not extend to the inner space 14. That is, the groove 94 does not overlap with the inner space 14 in the plan view, and may be present in a region between the inner periphery of the seam ring 93 and the outer periphery of the lid 92. In this case, the groove 94 does not communicate with the inside of the inner space 14. However, on the surface (rear surface 92b) of the lid 92 on which the groove 94 is provided, a region which is adjacent to the groove 94 and is adjacent to the inner space 14 in the plan view is not welded by the seam ring 93 and is set as an unwelded region. A region which overlaps with the seam ring except the unwelded region is welded by the seam welding machine so that the above-described exhaust can be performed through a small gap between the unwelded region of the lid 92 and the seam ring 93.

Modification Example of Concave Portion

Figure 7:
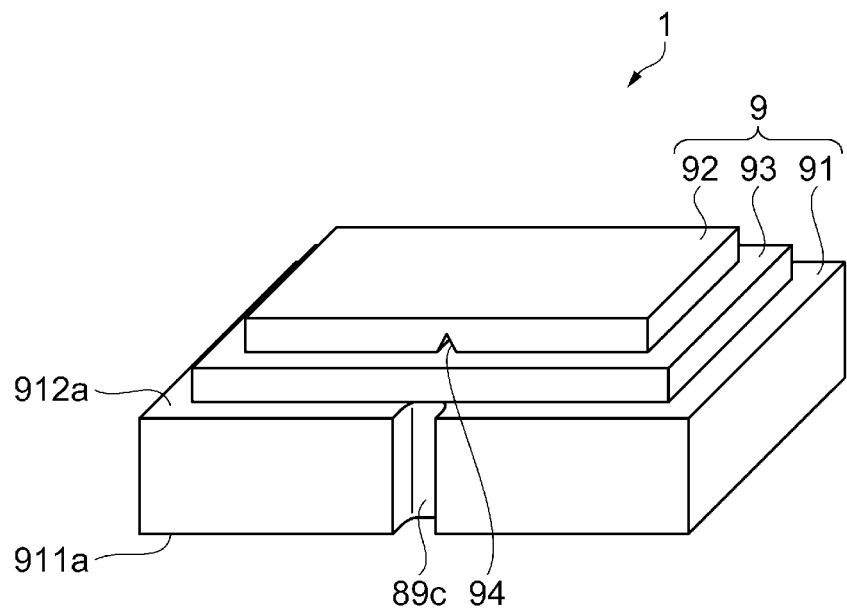
FIG. 7 is a perspective view showing a modification example of a concave portion.

Next, using FIG. 7, a modification example of the concave portion will be described. FIG. 7 is a perspective view showing a modification example of the concave portion. Since the configuration of the modification example is the same as that of the above-described first embodiment except for the configuration of the concave portion, the same reference numerals are attached to the same configurations in the following descriptions, and thus, the descriptions will be omitted and the different configurations will be described.

The package 9 in which a concave portion 89c of the modification example shown in FIG. 7 is formed includes the base 91, the seam ring 93 as the bonding material, and the lid 92 as the lid body. In the same drawing, the groove 94 provided in the lid 92 is shown, and a state in which sealing is not performed is shown.

The concave portion 89c is provided to penetrate the base 91 from the upper surface 912a of the side wall 912 (refer to FIGS. 6A to 6D) as the bonding surface which is a surface to which the lid 92 is bonded to the base surface 911a of a bottom plate which is an opposite surface of the upper surface 912a. In other words, the concave portion 89c is provided in a concave shape opened to three surfaces of the outer peripheral surface, the upper surface 912a and the base surface 911a of the base 91.

By providing the concave portion 89c having such a configuration, the length of the laser beam irradiation direction is increased in the concave portion 89c, and since the concave portion is penetrated, the base can be reliably prevented from being irradiated with the laser beam as the energy beam in the above-described sealing process.

Another Configuration of Vibrator

Figure 8A:
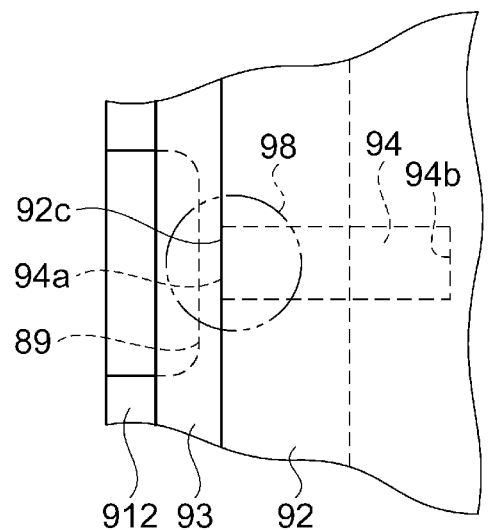
FIGS. 8A and 8B are schematic views showing another configuration of the vibrator as the first embodiment.
Figure 8B:
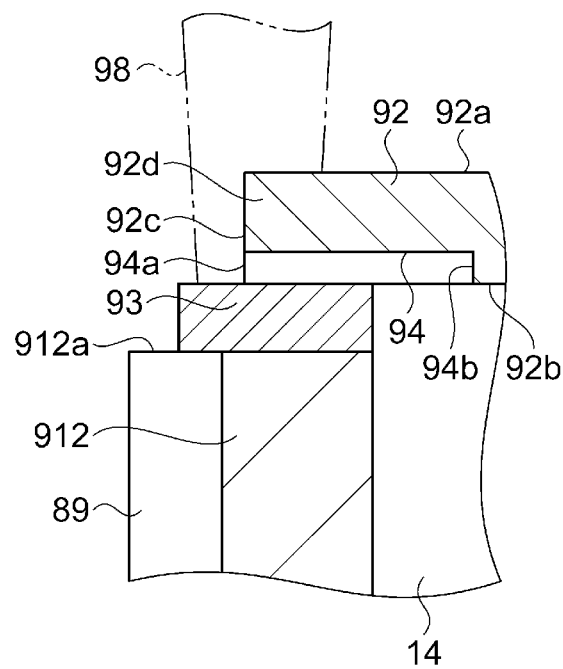

Next, another configuration of the vibrator of the first embodiment will be described with reference to FIGS. 8A and 8B. FIGS. 8A and 8B are schematic views showing another configuration of the vibrator as the first embodiment, and FIG. 8A is a partial plan view showing a part of the configuration of the vibrator, and FIG. 8B is a partial front cross-sectional view. In the following description, the same reference numerals are attached to the same configurations as in the first embodiment and the descriptions thereof will be omitted in some cases.

In the configuration of the vibrator shown in FIGS. 8A and 8B, the lid 92 as the lid body which is bonded to the base (side wall 912) through the seam ring 93 as the bonding material so as to close the opening of the inner space (housing space) 14 is provided. On the upper surface of the frame-shaped side wall 912, for example, the seam ring 93 formed of an alloy such as kovar is provided. The seam ring 93 functions as the bonding material between the lid 92 and the side wall 912 and is provided in a frame shape (approximately rectangular peripheral shape) along the upper surface of the side wall 912. In addition, the seam ring 93 is provided so as to overlap with a part of the concave portion 89 described later in the plan view seen from the lid 92 side.

The groove 94 with a bottom, which has an outer shape of an approximately rectangular shape and is provided from the outer periphery to the center portion, is provided on the rear surface 92b of the lid 92. The configuration of the lid 92 is the same as that of the above-described embodiment and thus, the description thereof will be omitted. When the lid 92 is placed on the seam ring 93, the groove 94 is arranged so as to overlap with the inner space 14. On the side wall 912, the concave portion 89 is provided at a position overlapping with an extended line to the outside of the groove 94 of the lid 92 placed on the seam ring 93. The concave portion 89 has a concave shape which is recessed toward the inside from the outer surface of the side wall 912.

In the vibrator having the configuration, in a state in which the exhaust of the inner space 14 is completed, the portion (communication portion) corresponding to the groove 94 used as the exhaust hole is irradiated with the laser beam 98 to melt the metal (kovar) of the left portion. At this time, the laser beam 98 is arranged such that the end portion on the outer side of the groove 94, that is, one end 94a of the groove 94 including the outer peripheral surface 92c of the lid 92 is included in the spot of the laser beam 98. Then, the laser beam 98 is irradiated. Although not shown in the drawings, the groove upper portion 92d on the surface 92a side of the lid 92 in the portion in which the groove 94 is provided is melted by heat energy generated by the irradiation with the laser beam 98, and while the groove 94 is filled with the molten metal, the molten metal flows on the seam ring 93. When the molten metal flows, if the irradiation with the laser beam 98 is stopped, the molten metal is solidified. This solidified molten metal serves as the sealing portion (melting portion) (not shown) to seal (close) the groove 94 airtightly.

In the vibrator having the configuration, the concave portion 89 is provided around the position to which the laser beam 98 is irradiated, and further, the seam ring 93 is provided so as to overlap with the concave portion 89, that is, so as to protrude toward the concave portion 89 in the plan view. In this manner, the laser beam 98 that is irradiated to the outside from the lid 92 is irradiated to the concave portion 89 and the seam ring 93. That is, the laser beam 98 is not directly irradiated to the upper surface 912a of the side wall 912 by providing the concave portion 89 and the seam ring 93 protruding toward the concave portion 89. Therefore, it is possible to prevent damage (for example, melting of the side wall 912 or micro-cracks generated on the side wall 912) of the base (side wall 912) due to the irradiation with the laser beam 98 from occurring.

The seam ring 93 may not overlap with the concave portion 89 in the plan view. In this case, in the sealing process, the unbonded portion is closed by the laser beam 98 in a state in which apart of the irradiation range of the laser beam 98 overlaps with a portion of the seam ring 93 exposed from the lid 92 in the plan view. That is, the laser beam 98 that is irradiated to the outside from the lid 92 is irradiated to the seam ring 93. Thus, some of the laser beam 98 is blocked by the seam ring 93 and is not directly irradiated to the upper surface of the side wall 912. Therefore, it is possible to prevent damage (for example, melting of the side wall 912 or micro-cracks generated on the side wall 912) of the base (side wall 912) due to the irradiation with the laser beam 98 from occurring.

Modification Examples of Groove

Figure 9A:
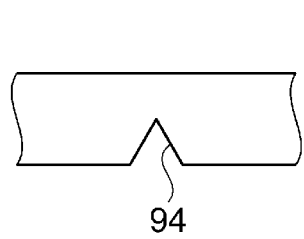
FIGS. 9A to 9C are front views showing modification examples of an opening shape of a groove.
Figure 9B:
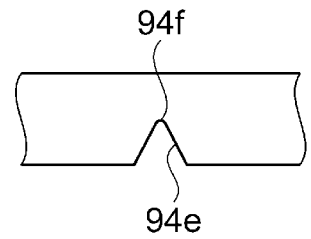
Figure 9C:
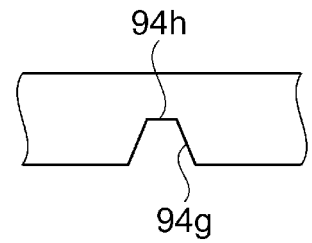

Here, the opening shape of the groove 94 provided in the lid 92 will be described using FIGS. 9A to 9C. FIGS. 9A to 9C are front views showing modification examples of an opening shape of the groove. In the above-described embodiment, the opening shape of the groove 94 provided in the lid 92 has been described as a wedge shape (for example, a triangle having two apexes on the rear surface 92b side) as shown in FIG. 9A. It is more preferable that the opening shape of the groove 94 be formed in a wedge shape, and a good moldability of a molding tool (for example, molding die) when the groove 94 is molded can be obtained. That is, since the distal end of the molding tool has a tapered shape, the molding tool can easily be pressed. In addition, the opening shape of the groove 94 may have another tapered shape. For example, as shown in FIG. 9B, a groove 94e may be formed in which a wedge-shaped distal end portion 94f has a circular arc shape, or as shown in FIG. 9C, a groove 94g may be formed in which a wedge-shaped distal end portion 94h has a so-called trapezoid shape formed in a narrow linear portion. In the grooves 94e and 94g having such shapes, the same effect can be obtained as in the groove 94.

Another Arrangement Example of Concave Portion and Groove

Figure 10:
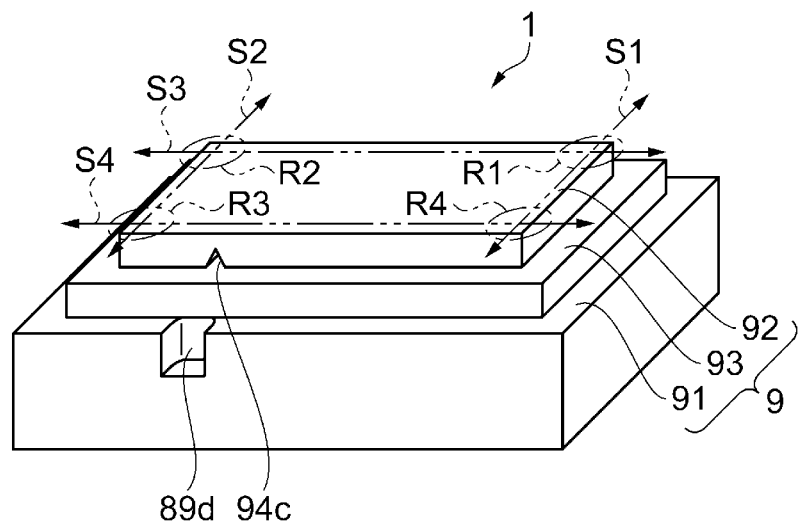
FIG. 10 is a perspective view for illustrating another arrangement example of the concave portion and the groove.

Here, with reference to FIG. 10, another arrangement example of the concave portion and the groove will be described. FIG. 10 is a perspective view for illustrating another arrangement example of the concave portion and the groove.

As shown in FIG. 10, a concave portion 89d and a groove 94c according to the arrangement example are provided around one end of one side in each of the base 91 and the lid 92 forming the package 9. Hereinafter, the detailed description will be made.

When the base 91 is bonded with the lid 92 through the seam ring 93 by seam welding, seam welding rollers move along an edge of each side as indicated by traces S1, S2, S3 and S4. As described above, the seam welding rollers move. Thus, in four corner portions, the seam welding rollers pass twice. Accordingly, if the groove 94c is provided in regions R1, R2, R3 and R4 in which the seam welding rollers pass twice, seam welding is performed twice, and the groove 94c is easily closed.

In addition, a large deformation in the thickness direction easily occurs around the center portion of each side of the base 91 and the lid 92, compared to the end portions. Therefore, a large residual stress is present around the center portion of each side of the lid 92 bonded to the package 9, compared to the end portions. While the large residual stress is maintained, if the groove 94c is sealed by melting, the residual stress is applied to the sealed portion and there is a concern that reliability in sealing may be deteriorated. Thus, to avoid this concern, the groove 94c is provided around the end portion of each side which has a relatively small residual stress, and thus, the sealed portion can be less influenced by the residual stress.

In this manner, the more stable groove 94c is formed by providing the concave portion 89d and the groove 94c around one end of one side of the lid 92 to avoid the regions R1, R2, R3 and R4 in which the seam welding rollers pass twice and thus, sealing with improved reliability can be performed.

In the vibrator 1 according to the above-described first embodiment, the lid 92 and the base 91 are bonded so that the inner space 14 communicates with the outside through the groove 94 (94c, 94e or 94g) provided in the lid 92 and the groove 94 is positioned around the concave portion 89 (89c or 89d) provided on the side surface of the side wall 912 as the base 91. In this manner, the pressure of the inner space 14 can be easily reduced, or the inside of the inner space can be easily made to an inert gas atmosphere by the groove 94 through which the inner space 14 communicates with the outside. The inner space 14 in which the pressure is reduced or the inside is made to the inert gas atmosphere can be sealed by irradiating the laser beam 98 to the communication portion to close the communication portion. Accordingly, sealing can be realized after a gas generated during the bonding of the lid 92 is removed from the inside of the package 9, and thus, it is possible to provide the vibrator 1 in which high quality air-tight sealing is realized.

In the vibrator 1 according to the above-described first embodiment, since the concave portion 89 is provided around the groove 94 at the position to which the laser beam 98 is irradiated, the laser beam 98 that is irradiated to the outside from the lid 92 is irradiated to the inside of the concave portion 89. That is, the laser beam 98 is not directly irradiated to the upper surface 912a of the side wall 912 by providing the concave portion 89. Therefore, it is possible to provide the vibrator 1 in which damage (for example, melting of the side wall 912 or micro-cracks generated on the side wall 912) of the base (side wall 912) due to the irradiation with the laser beam 98 is prevented from occurring.

Second Embodiment of Electronic Device

Figure 11:
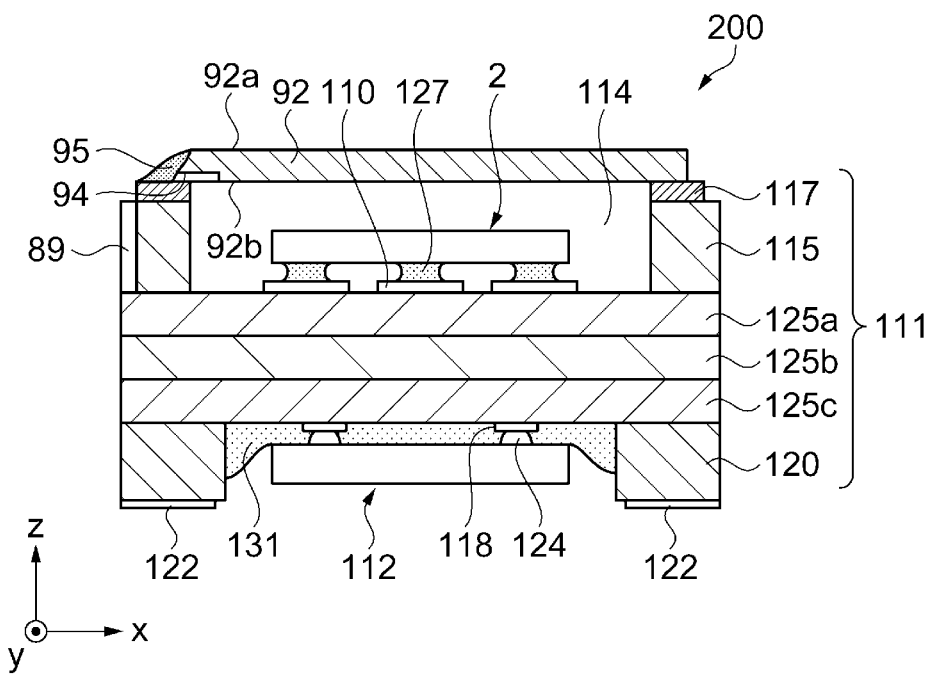
FIG. 11 is a front cross-sectional view schematically showing a gyro sensor as a second embodiment of the electronic device.

Next, as a second embodiment of the electronic device, an embodiment of a gyro sensor will be described with reference to FIG. 11. FIG. 11 is a front cross-sectional view schematically showing the gyro sensor. In the embodiment, the same reference numerals are attached to the same configurations as in the first embodiment and the descriptions thereof will be omitted in some cases.

A gyro sensor 200 includes the gyro element 2 as the electronic component, an IC 112 as a circuit element, a package (base) 111 as a housing container, and the lid 92 as the lid body. The package 111 formed of ceramic or the like has a third substrate 125c, a second substrate 125b, and a first substrate 125a, which are laminated, a frame-shaped side wall 115 which is provided in a surface peripheral edge portion of the first substrate 125a, and a frame-shaped side wall 120 which is provided in a surface peripheral edge portion of the third substrate 125c.

On the upper surface of the frame-shaped side wall 115, for example, a seam ring 117 as a bonding material formed of an alloy such as kovar is formed. The seam ring 117 functions as the bonding material for bonding with the lid 92, and is provided in a frame shape (peripheral shape) along the upper surface of the side wall 115. In the lid 92, the groove 94 is provided in the end portion of the rear surface 92b which is a surface facing the seam ring 117. The configuration of the lid 92 is the same as that of the above-described first embodiment. When the lid 92 is placed on the seam ring 117, the groove 94 is arranged so as to overlap with the inner space 114. Here, a space surrounded by the surface of the first substrate 125a and the inner wall of the frame-shaped side wall 115 becomes the inner space 114 of the gyro element 2, and a space surrounded by the third substrate 125c and the inner wall of the frame-shaped side wall 120 becomes a housing portion of the IC 112. After exhaust (deaeration) from the groove 94 is performed, the inner space 114 in which the gyro element 2 is housed is sealed with the sealing portion 95 formed by melting the lid 92 that is left in the portion in which the groove 94 is formed, and then the molten lid is solidified. In addition, plural external terminals 122 are provided on the surface (lower surface in the drawing) of the frame-shaped side wall 120. Further, the concave portion 89 is provided at a position facing the groove 94 of the lid 92 placed on the seam ring 117 on the side wall 115. The concave portion 89 has a concave shape which is recessed toward the inside from the outer surface of the side wall 115.

Connection pads 110 are formed on the surface of the first substrate 125a which is positioned in the inner space 114 of the gyro element 2, and the connection pads 110 and the gyro element 2 are electrically connected and fixed to each other. In the connection, a conductive fixing member 127, such as solder, silver paste, and conductive adhesive (adhesive in which a conductive filler, such as metal particles, is dispersed in a resin material) can be used. At this time, there is a gap between the gyro element 2 and the surface of the first substrate 125a due to the thickness of the conductive fixing member 127.

The opening of the inner space 114 in which the gyro element 2 is housed is closed by the lid 92 as the lid body and airtightly sealed. The configuration of the lid 92 is the same as that of the lid 92 described in the above-described first embodiment and thus, the detailed description will be omitted and the brief description will be made. The lid 92 closes the opening of the inner space 114 opened to the upper surface of the package 111 and is bonded to the periphery of the opening, for example, using a seam welding method. The lid 92 is formed of a kovar plate and has the surface 92a and the rear surface 92b having a front-rear relationship. As in the above-described first embodiment, the groove 94 with a bottom, which is provided from the outer peripheral surface 92c of the lid 92 to the center portion, is provided on the rear surface 92b side of the lid 92. Then, the exhaust of the inner space 114 from the groove 94 which is a gap between the seam ring 117 and the lid 92 is performed. Then, a portion including the end portion of the groove 94 is melted by a laser beam and the like and solidified to seal the groove airtightly.

In contrast, connection electrodes 118 are formed on the surface of the third substrate 125c positioned in the housing portion of the IC 112 and the connection electrodes 118 and the IC 112 are electrically connected and fixed to each other by welding using a gold (Au) bump 124. A gap between the IC 112 and the surface of the third substrate 125c is filled by arranging an underfill 131 such as resin. The resin may be provided so as to cover the IC 112. The connection pads 110, the connection electrodes 118, the external terminals 122 and the like are respectively connected by internal wirings, but the description and drawing thereof will be omitted in the invention.

Method of Manufacturing Gyro Sensor

Next, a method of manufacturing the gyro sensor 200 will be described, but the descriptions of the same processes as the processes described in the method of manufacturing the vibrator 1 will be omitted. The omitted processes include a process of housing the gyro element 2 in the inner space 114 of the package 111 as the base, a process of placing the lid 92 on the inner space 114, a process of bonding the lid 92 to the package 111, and a process of sealing the inner space 114 airtightly after exhaust is completed.

In addition to the above-described processes, in the manufacturing of the gyro sensor 200, the IC 112 is housed in the housing portion of the IC 112 surrounded by the frame-shaped side wall 120 provided in the surface peripheral edge portion of the third substrate 125c. The IC 112 is electrically connected and fixed to the connection electrodes 118 provided on the surface of the third substrate 125c using the gold (Au) bump 124. The gap between the IC 112 and the surface of the third substrate 125c is filled with the underfill 131 such as resin. The gyro sensor 200 is completed by the above processes.

According to the above-described second embodiment, the fluidity of the molten metal (lid 92) using the laser beam is improved as in the first embodiment and the sealing portion 95 can be reliably formed. Accordingly, the groove 94 can be reliably sealed and the gyro sensor 200 as the electronic device in which reliability in airtightness is improved can be manufactured. In addition, since the groove 94 as it is functions as an exhaust hole, dimension control of an unbonded portion (exhaust hole) used for exhaust in the related art is not necessary and stable exhaust and bonding (sealing) are performed. Thus, it is possible to suppress gas generated even in the case where the gyro sensor 200 is heated at a high temperature after bonding (sealing). Further, by stable exhaust and bonding (sealing), characteristics of the gyro element 2 as the electronic component that is housed in the package 111 can be prevented from being deteriorated due to the influence of the residual gas. Thus, it is possible to provide the gyro sensor 200 as the electronic device with stable characteristics.

In addition, since the concave portion 89 is provided around the groove 94 at the position to which the laser beam is irradiated as in the first embodiment, the laser beam 98 that is irradiated to the outside from the lid 92 is irradiated to the inside of the concave portion 89. That is, the laser beam 98 is not directly irradiated to the upper surface of the side wall 115 by providing the concave portion 89. Therefore, it is possible to provide the gyro sensor 200 in which the occurrence of damage (for example, melting of the side wall 115 or micro-cracks generated on the side wall 115) of the base (side wall 115) due to the irradiation with the laser beam 98 is prevented.

In the above-described description of the electronic device, as the electronic devices, the vibrator 1 and the gyro sensor 200 in which the so-called double T type gyro element 2 is used have been described as examples, but there is no limitation thereto. The invention can be applied to electronic devices in which an element is airtightly housed in a package. Other electronic devices may include, for example, a gyro sensor using an H-type or tuning fork type gyro element as an electronic component, a timing device (vibrator, oscillators and the like) using a vibrating element, a pressure sensor using a pressure sensitive element, and a semiconductor device using a semiconductor element.

As the vibrating element, a piezoelectric vibrating element such as an MEMS element using a piezoelectric body, a crystal vibrator element such as a tuning fork type crystal vibrator element using crystal as a material, which performs flexural vibration, a longitudinal vibration type crystal vibrator element, a thickness sliding crystal vibrator element and the like can be suitably used.

Electric Apparatus

Next, an electronic apparatus to which the vibrator 1 as the electronic device or the gyro sensor 200 as the electronic device according to the embodiment of the invention is applied will be described in detail based on FIGS. 12 to 14. In the description, an example in which the vibrator 1 using the gyro element 2 is applied will be described.

Figure 12:
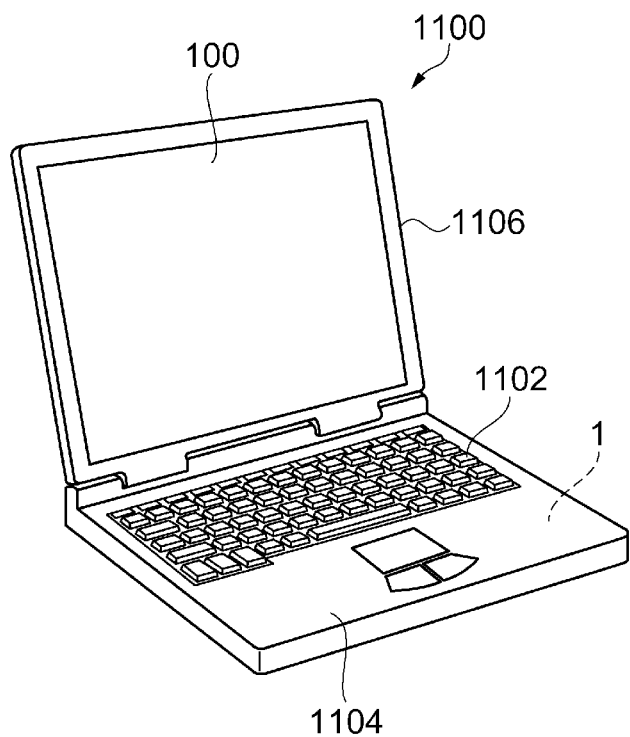
FIG. 12 is a perspective view showing a configuration of a mobile type personal computer as an example of an electronic apparatus.

FIG. 12 is a perspective view schematically showing a configuration of a mobile type (or notebook type) personal computer as the electronic apparatus including the vibrator 1 as the electronic device according to the embodiment of the invention. In the drawing, a personal computer 1100 is formed by a main body portion 1104 which includes a keyboard 1102 and a display unit 1106 which includes a display portion 100, and the display unit 1106 is supported so as to rotate via a hinge structure portion with respect to the main body portion 1104. Such a personal computer 1100 is equipped with the vibrator 1 using the gyro element 2 having a function of detecting an angular velocity.

Figure 13:
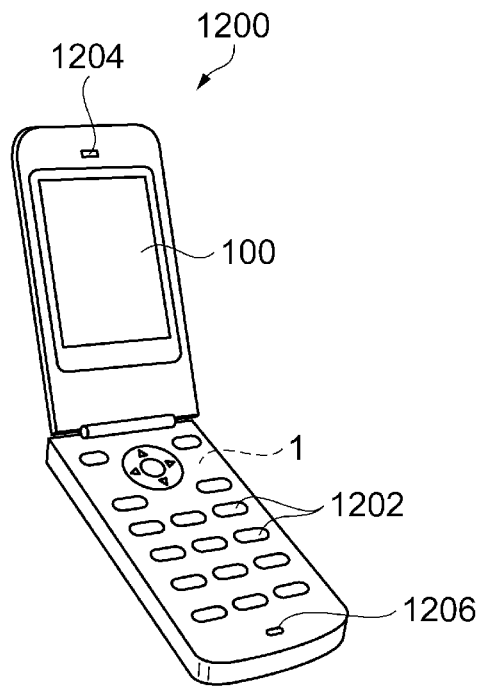
FIG. 13 is a perspective view showing a configuration of a mobile phone as an example of an electronic apparatus.

FIG. 13 is a perspective view schematically showing a configuration of a mobile phone (which also includes PHS) as the electronic apparatus including the vibrator 1 as the electronic device according to the embodiment of the invention. In the drawing, a mobile phone 1200 includes plural operation buttons 1202, an ear piece 1204, and a mouth piece 1206, and a display portion 100 is disposed between the operation buttons 1202 and the ear piece 1204. Such a mobile phone 1200 is equipped with the vibrator 1 using the gyro element 2 having a function as an angular velocity sensor.

Figure 14:
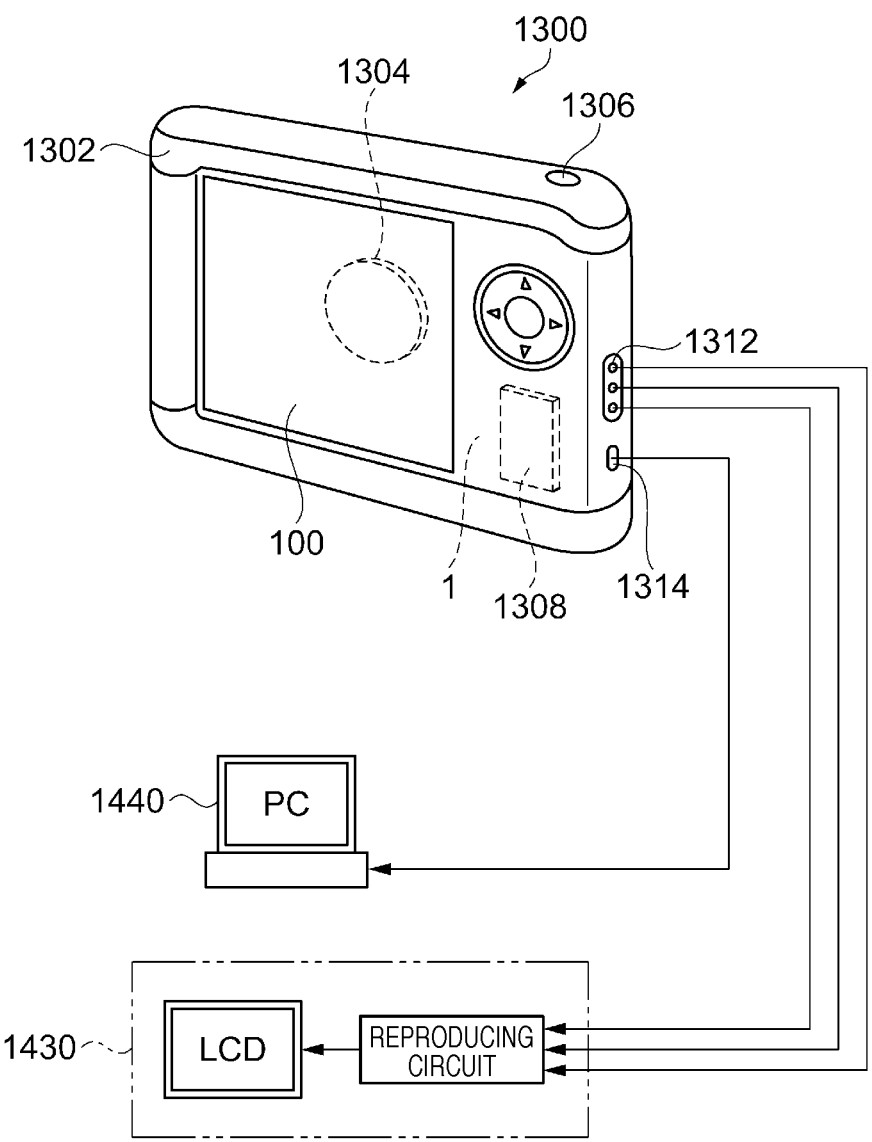
FIG. 14 is a perspective view showing a configuration of a digital still camera as an example of an electronic apparatus.

FIG. 14 is a perspective view schematically showing a configuration of a digital still camera as the electronic apparatus including the vibrator 1 as the electronic device according to the embodiment of the invention. Moreover, FIG. 14 also shows the connection with external equipment in a simplified manner. Here, in a general camera, a silver salt photographic film is exposed by the light image of a subject. In contrast, in a digital still camera 1300, the light image of the subject is photo-electrically converted by an imaging element such as a charge coupled device (CCD), and imaging signals (image signals) are generated.

A display portion 100 is provided on the rear surface of a case (body) 1302 in the digital still camera 1300 and configured so as to perform display based on imaging signals by the CCD, and the display portion 100 functions as a finder which displays the subject as electronic images. In addition, a light receiving unit 1304, which includes optical lenses (an imaging optical system), the CCD, and the like, is provided on the front surface side (the rear surface side in the drawing) of the case 1302.

If a photographer confirms the subject image which is displayed on the display portion 100 and presses a shutter button 1306, the imaging signals of the CCD are transmitted and stored to a memory 1308. Moreover, in the digital still camera 1300, a video signal output terminal 1312 and an input and output terminal for data communication 1314 are provided on the side surface of the case 1302. In addition, as shown in the drawing, a television monitor 1430 is connected to the video signal output terminal 1312 and a personal computer 1440 is connected to the input and output terminal for data communication 1314, if necessary. Further, the imaging signals which are stored in the memory 1308 are output to the television monitor 1430 or the personal computer 1440 according to a predetermined operation. Such a digital still camera 1300 is equipped with the vibrator 1 using the gyro element 2 having a function as an angular velocity sensor.

The vibrator 1 according to the embodiment of the invention can be applied to electronic apparatuses such as an ink jet type ejecting apparatus (for example, an ink jet printer), a laptop type personal computer, a television, a video camera, a video tape recorder, a car navigation apparatus, a pager, an electronic organizer (with a communication function), an electronic dictionary, an electronic calculator, an electronic game machine, a word processor, a work station, a videophone, a television monitor for crime prevention, electronic binoculars, a POS terminal, a medical device (for example, an electronic thermometer, a sphygmomanometer, a blood sugar meter, an electrocardiogram measurement device, ultrasonic diagnostic device, an electronic endoscope), a fish-finder, a various measurement devices, meters (for example, meters of a vehicle, an airplane, and a ship), a flight simulator, or the like, in addition to the personal computer (mobile type personal computer) shown in FIG. 12, the mobile phone shown in FIG. 13, and the digital still camera shown in FIG. 14.

Moving Object

Figure 15:
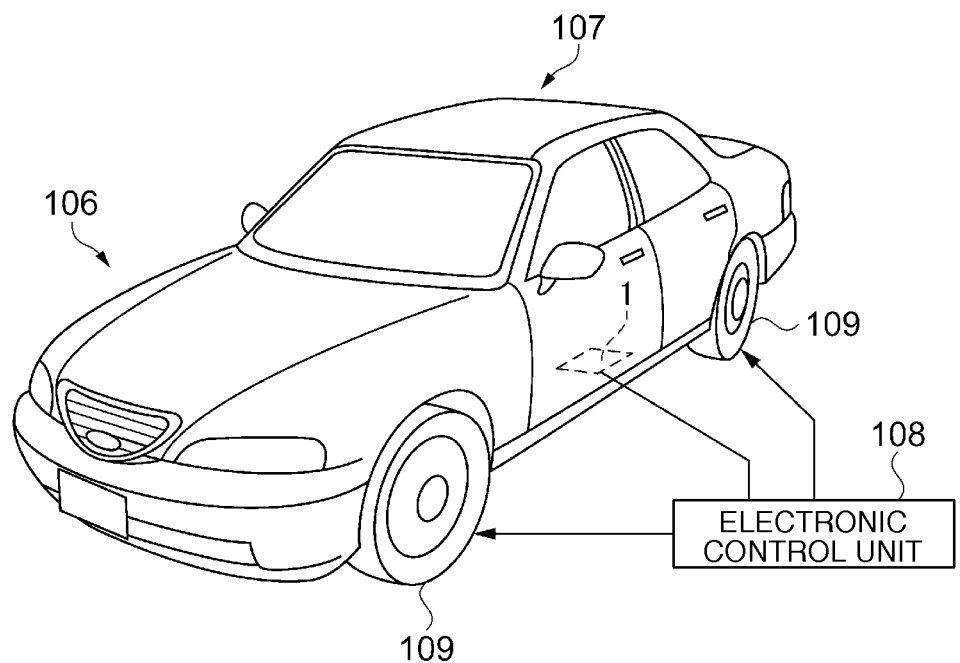
FIG. 15 is a perspective view showing a configuration of an automobile as an example of a moving object.

FIG. 15 is a perspective view schematically showing a configuration of an automobile as an example of a moving object. In an automobile 106, the vibrator 1 as the electronic device according to the invention is mounted. For example, as shown in the same drawing, an electronic control unit 108 with the vibrator 1 using the gyro element 2 equipped therein which controls tires 109 and the like is mounted in a vehicle body 107 of the automobile 106 as a moving object. Further, the vibrator 1 can be broadly applied to various electronic control units (ECUs) such as a keyless entry, an immobilizer, a car navigation system, a car air-conditioner, an anti-lock brake system (ABS), an airbag, a tire pressure monitoring system (TPMS), an engine control system, a battery monitor of a hybrid automobile or an electric automobile, or a vehicle attitude control system.

The entire disclosure of Japanese Patent Application Nos. 2013-015206, filed Jan. 30, 2013 and 2013-015207, filed Jan. 30, 2013 are expressly incorporated by reference herein.

What is claimed is:

1. A method of manufacturing an electronic device in which an inner space for housing an electronic component is formed between a base and a lid body, and the base and the lid body are bonded, the method comprising:

preparing the base to have a base bonding surface at a periphery of the base;

preparing the lid body to have a lid bonding surface facing the inner space and a lid top surface opposite to the lid bonding surface, and a groove at a part of the lid bonding surface that is bonded with the base bonding surface of the base;

housing the electronic component in the inner space;

bonding the lid bonding surface of the lid body to the base bonding surface of the base so that the inner space communicates with a region exterior of the inner space via the groove;

exhausting an air in the inner space to the outer region via the groove; and welding a part of the groove closed by applying an energy beam to the lid top surface located above the groove, wherein, during the welding step, the energy beam is in a state in which a part of an irradiation range of the energy beam is positioned outside the base bonding surface in a plan view.

2. The method of manufacturing an electronic device according to claim 1, wherein a concavity is provided on an outer side surface of the base, and during the welding step of closing the part of the groove, the energy beam is in a state in which a part of the irradiation range of the energy beam is overlapped with the concavity in the plan view.

3. The method of manufacturing an electronic device according to claim 2, wherein the concavity extends from the base bonding surface to a base bottom surface that is located opposite to the base bonding surface.

4. The method of manufacturing an electronic device according to claim 1, wherein a bonding material is provided between the base bonding surface and the lid bonding surface, in the bonding step, an outer edge of the bonding material is offset from an outer edge of the lid bonding surface so that the bonding material is exposed from the lid body in the plan view, and during the welding step of closing the groove, a part of the irradiation range of the energy beam overlaps with an exposed portion of the bonding material exposed from the lid body in the plan view.

5. The method of manufacturing an electronic device according to claim 2, wherein a bonding material is provided between the base bonding surface and the lid bonding surface, and the bonding material is provided over the concavity so that an outer edge of the bonding material overlaps with the concavity in the plan view, in the bonding step, the outer edge of the bonding material is offset from an outer edge of the lid bonding surface so that the bonding material is exposed from the lid body in the plan view, and during the welding step of closing the groove, a part of the irradiation range of the energy beam overlaps with an exposed portion of the bonding material exposed from the lid body in the plan view, and the exposed portion overlaps with the concavity in the plan view.

6. The method of manufacturing an electronic device according to claim 2,
wherein in the bonding step, an edge of the groove is spaced apart from the concavity in the plan view so that a part of the groove is located between the concavity and the inner space in the plan view.

7. The method of manufacturing an electronic device according to claim 1,
wherein in the welding step of closing the groove, the energy beam is applied toward the lid top surface located above the groove a plurality of times.

8. A method of manufacturing an electronic device in which an inner space for housing an electronic component is formed between a base and a lid body, and the base and the lid body are bonded, the method comprising:
preparing the base to have a base bonding surface at a periphery of the base;
preparing the lid body to have a lid bonding surface facing the inner space and a lid top surface opposite to the lid bonding surface, and a groove at a part of the lid bonding surface that is bonded with the base bonding surface of the base;
housing the electronic component in the inner space;
bonding the lid bonding surface of the lid body to the base bonding surface of the base by a bonding material so that the inner space communicates with a region exterior of the inner space via the groove, and an outer edge of the bonding material is offset from an outer edge of the lid bonding surface so that the bonding material is exposed from the lid body in the plan view; and
welding a part of the groove closed by applying an energy beam to the lid top surface located above the groove, wherein, during the welding step, the energy beam is in a state in which a part of an irradiation range of the energy beam overlaps with an exposed portion of the bonding material exposed from the lid body in the plan view.

* * * * *